United States Patent [19]

Lewis et al.

[11] Patent Number: 5,576,979
[45] Date of Patent: Nov. 19, 1996

[54] AUTOMATED DEVELOPMENT OF TIMING DIAGRAMS FOR ELECTRICAL CIRCUITS

[75] Inventors: Lawrence E. Lewis, Kirkland; Michael S. Meredith, Redmond, both of Wash.

[73] Assignee: Chronology Corp., Redmond, Wash.

[21] Appl. No.: 351,606

[22] Filed: Dec. 8, 1994

Related U.S. Application Data

[63] Continuation of Ser. No. 791,794, Nov. 12, 1991, Pat. No. 5,381,524.

[51] Int. Cl.$^6$ ....................................................... G06F 3/00
[52] U.S. Cl. ........................... 364/578; 364/488; 395/326
[58] Field of Search ..................................... 395/155–161; 345/117–120, 134, 131; 364/525, 488, 578, 480–487, 490–491

[56] References Cited

U.S. PATENT DOCUMENTS

| | | |
|---|---|---|
| 4,554,536 | 11/1985 | Jackson . |
| 4,648,002 | 3/1987 | Johnson et al. ........................ 395/155 |
| 4,744,084 | 5/1988 | Beck et al. . |
| 4,789,962 | 12/1988 | Berry et al. ............................ 395/155 |
| 4,873,647 | 10/1989 | Banki et al. . |
| 4,876,655 | 10/1989 | Carlton et al. . |
| 4,924,430 | 5/1990 | Zasio et al. . |
| 4,937,827 | 6/1990 | Beck et al. . |
| 4,977,514 | 12/1990 | Bush . |
| 5,095,454 | 3/1992 | Huang . |
| 5,105,374 | 4/1992 | Yoshida . |
| 5,168,455 | 12/1992 | Hooper . |
| 5,239,493 | 8/1993 | Sherman . |

OTHER PUBLICATIONS

Advanced Interface Design Guide, IBM, Jun. 1989, pp. 95–99.
Exhibit B: "dV/dt Timing Diagram Accelerator–Users Guide–Version 3.0 for Use with MS–DOS", Dr. Design, Inc., Nov. 15, 1991.
Exhibt C: Electronic Design, "Timing Analyzer Serves as Spreadsheet", Apr. 26, 1990.
Exhibit D: "dV/dt (product box facsimile)", Version 2.0, Mar., 1990.
Exhibit E: "It's About Time", Chronology Corp. advertisement, Nov., 1990.
Exhibit F: Electronic Products, "Software Automates Timing Diagrams", pp. 22–23, 29–30 and close–up of p. 29, Nov., 1990.
Exhibit G: "It's About Time", Chronology Corp. brochure, Nov., 1990.
Exhibit H: Gaetano Borriello, "A New Interface Specification Methodology and its Application to Transducer Synthesis", University of California, 1988.
Exhibit I: "Cedrus Manual Created from Help File", Apr. 1995 and TD software, Cedrus, Dec. 1989.
Exhibit 3: "dV/dt Timing Diagram Editor–User's Guide 1.0 for Use with the Apple Macintosh", Engineerium, La Jolla, CA, dated 1988.
Exhibit 4: "dV/dt Timing Diagram Editor–Tutorial 1.0 for Use with the Apple Macintosh", Engineerium, La Jolla, CA, dated 1988.
Exhibit 5: "dV/dt Timing Diagram Accelerator–User's Guide–Version 2.0 for Use with the Apple Macintosh", Dr. Design, Inc., San Diego, CA, dated 1989, 1990.

(List continued on next page.)

*Primary Examiner*—Kee Mei Tung
*Assistant Examiner*—John E. Breene
*Attorney, Agent, or Firm*—Merchant, Gould, Smith, Edell, Welter & Schmidt

[57] ABSTRACT

A computer-implemented method and apparatus that automates the entry, modification, and verification of timing diagrams for electrical circuits. The computer-implemented method and apparatus also provides an automated mechanism for analyzing these timing diagrams and verifying that the timing relationships specified for the circuit are met using the parts selected for the circuit.

3 Claims, 14 Drawing Sheets

OTHER PUBLICATIONS

Exhibit 6: "Finally! A Spreadsheet That Makes Complex Timing Analysis Easy", advertisement, Personal Computing Tools, Los Gatos, CA, Jul. 14, 1995.

Exhibit 7: "Finally! A Spreadsheet That Makes Complex Timing Analysis Easy", 162,Dv/dt, Final Copy, Personal Computing Tools, Los Gatos, CA, Jan. 13, 1990.

Exhibit 8: "dV/dt Timing Diagram Accelerator–The Digital Designer's Spreadsheet", Dr. Design, Inc., San Diego, CA, Jul. 14, 1995.

Exhibit 9: "Cedrus Timing Diagram–User Guide", Cedrus, Tigard, OR, dated 1988, 1989 (pp. 1, 6–9, 17–19).

Exhibit 10: "Cedrus Timing Diagram–User Guide", Cedrus, Tigard, OR, dated 1988, 1989.

Exhibit 12: "A New Interface Specification Methodology and its Application to Transducer Synthesis", thesis, Gaetano Borriello, Report No. UCB/CSD 88/430, CA, May 26, 1988, (entire document).

Rosenberger, "Logic Calc", IEEE Conf., Mar. 1988, pp. 133–137.

Rao, "Typical Applications of Microcomputer Spreadsheets to EE Problems", IEEE Trans on Education, Nov. 1984, pp. 237–242.

Huelsman, "EE Applications of Microcomputer Spreadsheet Analysis Programs", IEEE Trans on Education, May 1984, pp. 86–92.

Hayns, "Circuit Design with Lotus 1–2–3–", Byte, Fall 1985, pp. 143–156.

Spooner, "Signal Processing Using Spreadsheet Software", Oceans '88 Conference, Nov. 1988, pp. 283–286.

EL–HAJJ et al., "A Spreadsheet Simulation of Logic Networks", IEEE Trans. on Education, Feb. 1991, pp. 43–46.

Page, "Vantage Spreadsheet", EURO ASIC '90 Conference, Jun. 1990, pp. 181–186.

Seppanen, "Special Purpose Simulator Development", 1990 Winter Simulation Conference, Dec. 1990, pp. 67–71.

Hara et al., "Timing Analysis Improves Efficiency of ASIC Design", EDN, May 26, 1988, pp. 195–201.

Goering, "Apple Chases Elusive EDA", EET, Jul. 2, 1990, p. 1.

Semiconductor Industry & Business Survey, Aug. 26, 1991.

Gogesch, "Logic Simulators Exhibit Different Levels of Device Characterization", EDN, Oct. 13, 1988, pp. 213–217.

Benedict et al., "Logic Simulator in an Introductory Course", IEEE Proc., Sep. 1991, p. 760.

Goering, "VHDL Simulator provides Interactive Verification", Computer Design, May 15, 1988, p. 24(1), summary.

Garner, "Doctor Design Speeds Timing Analysis in Circuit Board Design", p. 15(1).

Garner, "Doctor Design Updates dU/dt", MacWeek, Oct. 22, 1991, p. 22(1).

Weiss, "Dr. Design prescribes dU/dt", EET, Apr. 23, 1990, p. 56, full text.

Microsoft Works User's Guide, Microsoft Corp., pp. 103–173.

Test Systems Strategies, Inc., "Strategies, for Owners and Users of ATE and CAE Systems, DAC Special Edition 18", 1990 pp. 1–11.

AUTOMATED DEVELOPMENT OF TIMING DIAGRAMS FOR ELECTRICAL CIRCUITS

This is a continuation of application Ser. No. 07/791,794, filed Nov. 12, 1991, now U.S. Pat. No. 5,381,524.

BACKGROUND OF THE INVENTION

1. Field of the Invention

This invention relates in general to timing analysis and verification tools for electrical circuits, and in particular to a computer program which automates the entry, modification, and analysis of timing diagrams.

2. Description of Related Art

Timing diagrams are a traditional type of chart that engineers use to describe the proper sequence and order of events in a circuit, including timing dependencies and relationships. Typically, the task of timing analysis and verification is done manually using paper and pencils.

Events in digital circuits are usually driven by a clock signal. If clock and data signals are synchronized, everything works perfectly. If clock and data signals are not synchronized, then a device may sense a prior value on the data signal, or possibly even a "garbage" value. Timing verification can detect errors in a design by indicating that events are occurring too far apart or to close together to be properly synchronized. Timing verification can determine whether there are such errors in the design.

Such errors can happen intermittently or all the time. If the error happens all the time, it is often easy to correct. But, if the error happens intermittently, e.g., once or twice a year, it may create tremendous problems and be virtually impossible to correct.

When a circuit is built, an engineer will use timing verification techniques to identify such errors so that they can be eliminated. However, timing verification relies on an accurate specification of the timing relationships of all devices used in the circuit.

Unfortunately, when the circuit goes into production, many copies of individual devices are used, and the timing effect, i.e., the delay, caused by those devices will vary from copy to copy. Typically, the delay associated with a particular copy of a device will fall somewhere within some predetermined range.

Further, there may be hundred, thousands, or millions of devices within the circuit. When constructing a timing diagram of a circuit to use for verification purposes, chances are that many timing relationships need to be re-evaluated anytime the specifications of any one device is changed. This is particularly true as device and circuit speeds increase and timing margins, i.e., the amount of slack time between events, decrease.

Timing margins can often be less than one-billionth of a second. When device and circuit speeds were slower, manual methods of evaluating a circuit's operation and verifying timing relationships therein proved successful. However, with the higher speeds and more complex circuits, there is a need in the art for automated methods of circuit evaluation and verification.

The prior art includes a category of tools called Timing Analysis and Verification Software that can be used to perform circuit evaluation and verification. The two main tools in this category are called Digital Simulators and Static Timing Analyzers. Simulators and analyzers can be used for some degree of timing verification.

A simulator is typically used to test all the various logical conditions of the devices comprising the circuit. Simulators are good for verifying that a circuit works i.e., that the fundamental logic of the circuit is correct, but they are poor for determining whether the circuit will work with worst case timing variations. It is difficult to stimulate a simulator to make sure that worst case timing variations have been tried.

One reason for this is that simulators are good at treating devices having a single delay associated therewith, but they are poor at treating devices having a range of possible delays. At best, simulators set all devices to their minimum possible delay and simulate that, and then they set all devices to their maximum possible delay and simulate that. Such a test is not a true indication of circuit behavior, because, in reality, circuits are never built with all the devices at their minimum or maximum delay. Instead, circuits always have some mix of delays somewhere between their specified ranges.

Static timing analyzers are usually batch programs, i.e., there is no human intervention until after the analyzer has completed its task. Analyzers, rather than relying on stimulation of the circuit, attempt a comprehensive analysis of the circuit to test for timing problems. The input to an analyzer is a completed circuit diagram; the output of the analyzer is a list of possible timing violations. The problem with verifiers are two-fold. First, they only work with a subset of circuits called synchronous circuits. Second, they have a tendency to be overly conservative. They flag many conditions as invalid which are valid.

A problem for both simulators and analyzers, however, is that they require a model for every single device in the circuit. Such models are often non-existent and difficult to produce.

Another problem with both simulators and timing analyzers is that they cannot be used until the design of the circuit is complete. Both simulators and timing analyzers can only attempt to verify, after the fact, whether the circuit is correct; they are not design tools.

Because timing diagrams and the traditional tools used by engineers to create designs, there is a need in the art for timing verification tools which automate the entry and modification of timing diagrams. There is also a need for an automated mechanism for analyzing the timing diagrams and verifying that specified timing relationships are met using the parts selected for the design.

SUMMARY OF THE INVENTION

To overcome the limitations in the prior art described above, and to overcome other limitations that will become apparent upon reading and understanding the present specification, the present invention discloses a computer program which automates the entry, modification, and verification of timing diagrams for electrical circuits. The present invention also provides an automated mechanism for analyzing these timing diagrams and verifying that the timing relationships specified for the circuit are met using the parts selected for the circuit.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

OPERATING ENVIRONMENT

Figure 1:
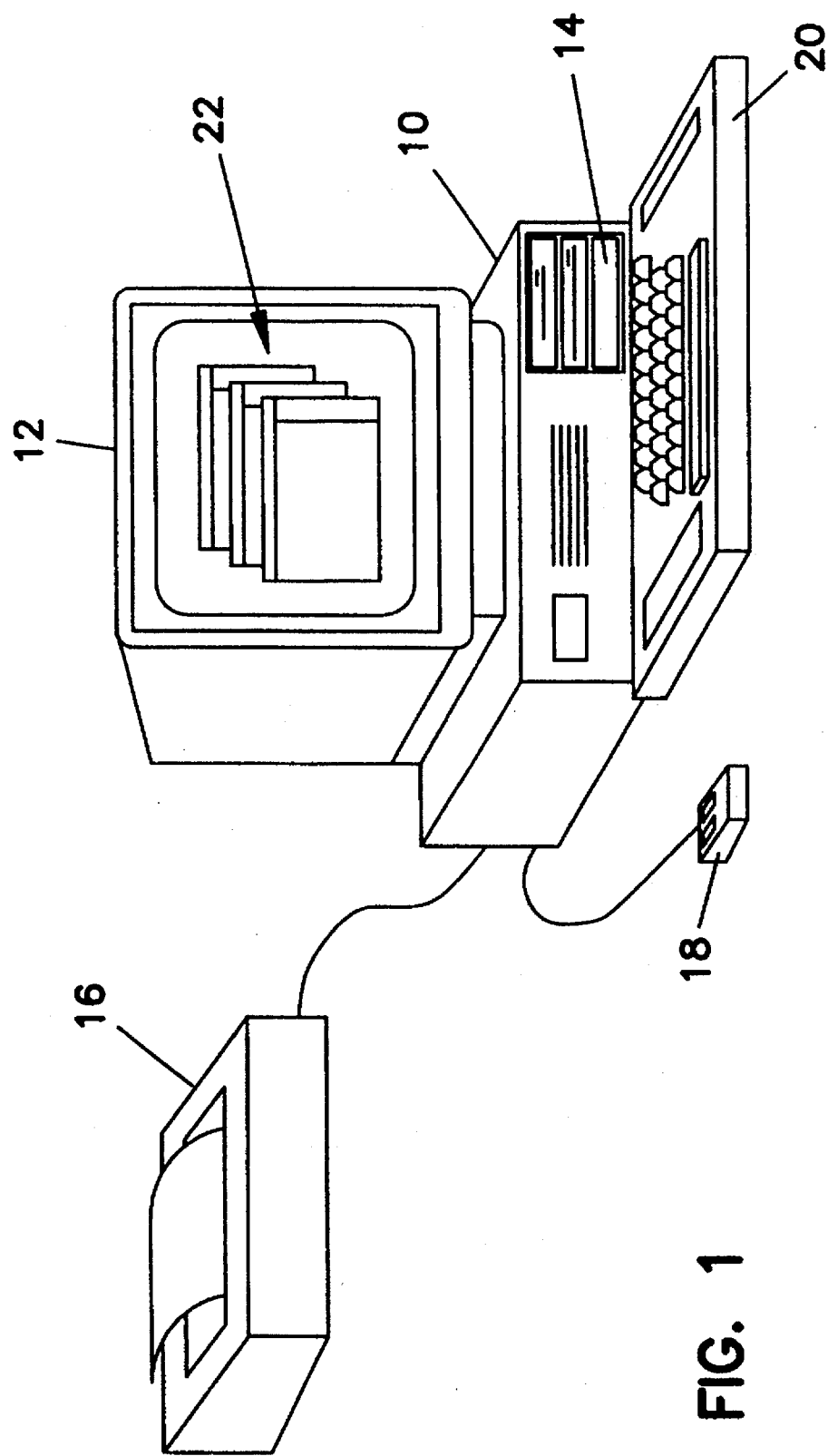
FIG. 1 is a block diagram illustrating the hardware components of the present invention.

FIG. 1 illustrates one possible embodiment of the hardware comprising the present invention. The present invention operates on a personal computer (PC) 10. It is envisioned that attached to the PC 10 will be monitor 12, disk storage 14, and printer 16 peripherals. Also included in the preferred embodiment are input devices, for example, a mouse pointing device 18 and a keyboard 20.

In the preferred embodiment of present invention, the PC is running under the WINDOWS™ Version 3.0 operating environment 22. However, the present specification does not go into details on how the WINDOWS™ operating environment 22 works nor how to program in the environment 22, as these details are well known in the art. The present specification assumes that the reader has an understanding of basic concepts within the WINDOWS™ operating environment 22, such as selecting objects, editing text, working with menus and dialog boxes, etc.

INTERNAL OPERATION

Figure 2:
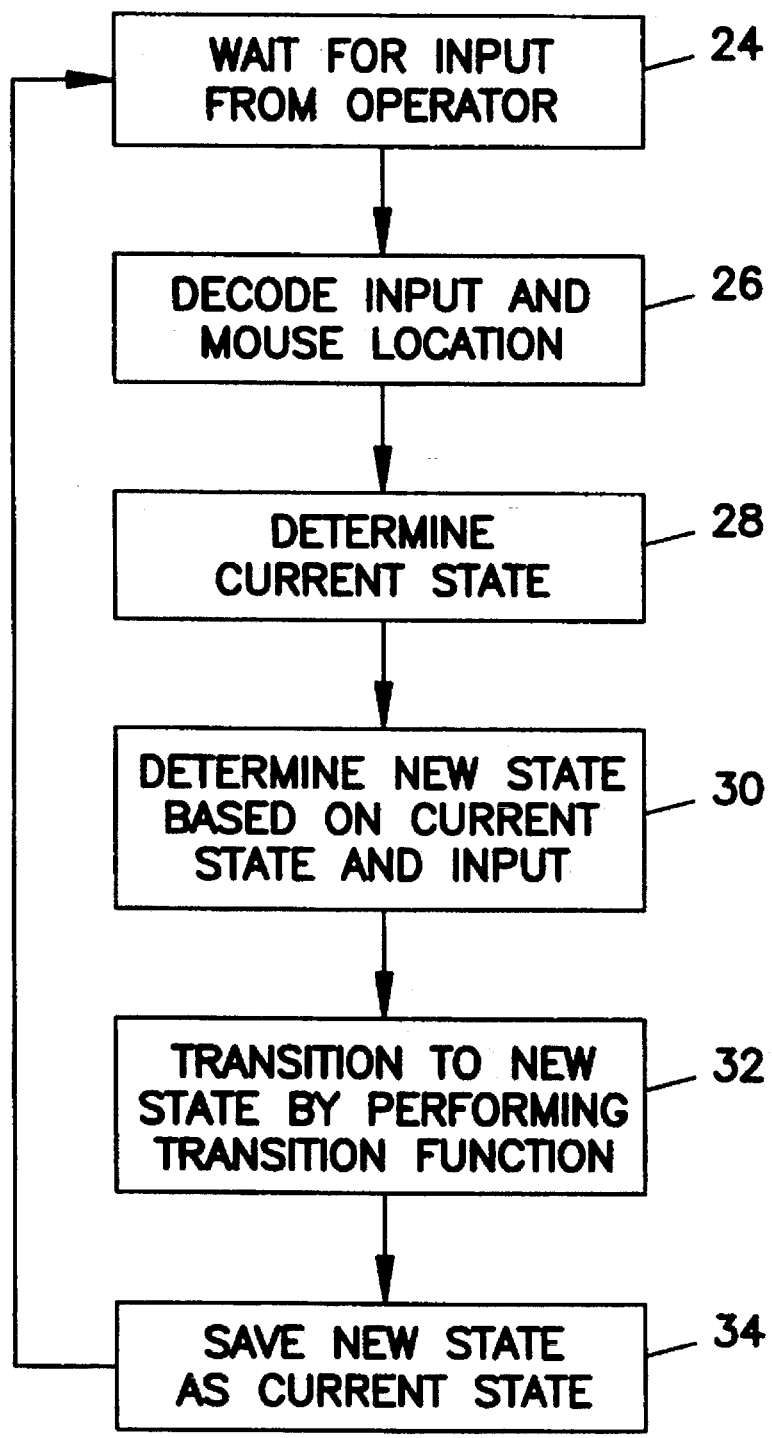
FIG. 2 is a flow diagram illustrating the internal operation of the computer program of the present invention.

FIG. 2 is a flow chart defining the overall logic of the computer program which directs the operation of the present invention. The computer program defines a set of states and operations, so that a particular input while the computer program is in a particular state causes a transition to another state, which invokes a corresponding function. The input used to determine these state transitions includes not only the identity of the input but its location on the PC monitor 12 as well.

Block 24 represents the wait for input from the operator. Block 26 represents the decoding of the input and the mouse location when the input is received from the operator. Block 28 represents the determination of the current state of the computer program. Block 30 represents the determination of the new state based on the current state and the operator input. Block 32 represents the transition to the new state wherein the computer program performs a transition function. Block 34 represents the saving of the new state as the current state. Control then returns to block 24 to await further input from the operator.

For example, if an operator takes a mouse and clicks at a certain place on the monitor, a part of a timing diagram waveform is drawn from last mouse location to the new mouse location. The computer program is then in a state that is awaiting additional operator input that defines the event that goes with the waveform, e.g., adding an edge. When the operator input is received, the computer program determines what functions to perform based on the current state, the input from the operator, and then performs the desired function.

THE WINDOWS

Figure 3:
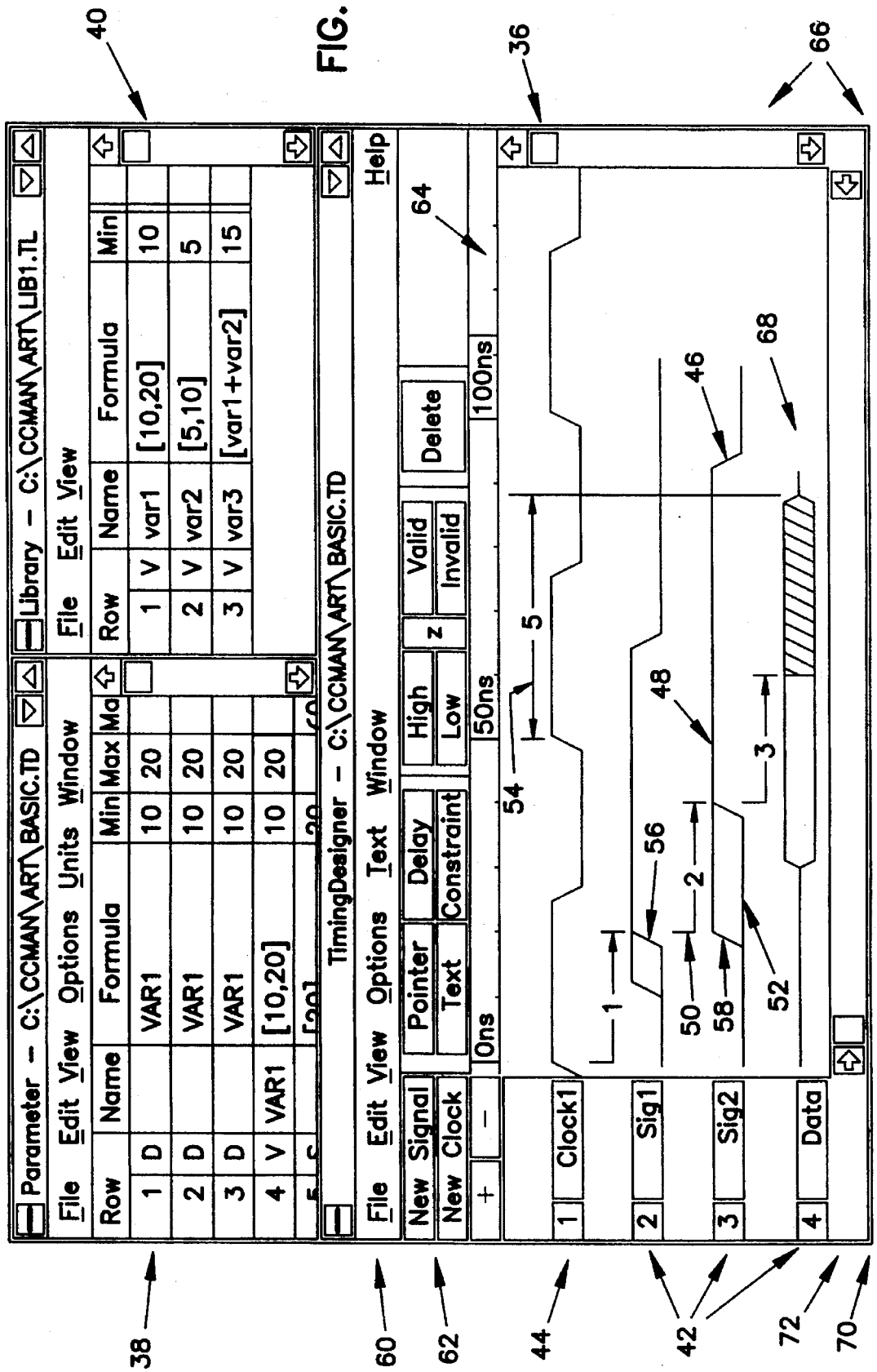
FIG. 3 is a block diagram illustrating the windows displayed by the present invention.

FIG. 3 illustrates the three different windows displayed by the present invention on the PC monitor 12: a Diagram Window 36; a Parameter Spreadsheet 38; and a Library Spreadsheet 40. The Diagram Window 36 is used for drawing timing diagrams. The Parameter Spreadsheet 38 is used for specifying MIN/MAX values for delays, constraints, variables, signal skews, and formulas that describe the timing relationships between edges in the timing diagram. The Library Spreadsheet 40 is used for specifying common MIN/MAX variables which may then be used in many different timing diagrams.

Typically, the Diagram Window 36, Parameter Spreadsheet 38 and Library Spreadsheet 40 are each a separate window on the PC monitor 12. FIG. 3 illustrates the three windows in a "tiled" manner of display. Those skilled in the art will recognize that, in a WINDOWS™ environment operating on PCs, the three windows could be displayed in a "cascaded" manner as well.

TIMING DIAGRAMS

In the Diagram Window 36 of FIG. 3, a timing diagram is shown according to the present invention. The timing diagram is a graphical representation of a design that shows the sequence of timing relationships between signals and edges thereof. The timing diagrams use a number of graphic elements to portray timing relationships as discussed further hereinafter.

Four signals are shown in FIG. 3, including three signal waveforms 42 and a clock waveform 44. Waveforms are comprised of edges and states that describe the functioning of electrical signal in a circuit over time. Signal waveforms 42 are drawn by an operator with a mouse in the Diagram Window and comprise an ordered sequence of states and edges. Signal waveforms describe data, logic or control signals within a circuit. Clock waveforms 44 are a special type of waveform that are regular and periodic. Clock waveforms 44 are created in the present invention using a dialog box to enter various parameters therefor, as described further hereinafter.

Edges 46 in the waveform indicate transitions from one state to another. In the present invention, edges 46 are named for the state 48 to which they transition. For example, an edge 46 between an invalid state and a valid state is called a valid edge.

In the real world, the exact time at which an edge 46 occurs is rarely known to any degree of accuracy. Rather, an edge 46 has an earliest and latest expected arrival based on a variable delay 50 which is termed an "uncertainty 52." In the Diagram Window 36, the uncertainty 52 of an edge 46 is represented by a grey area. For example, in FIG. 3 the uncertainty 52 of the first edge 46 in waveform SIG2 is caused by different expected arrivals of the edge 46.

Uncertainty 52 appears on an edge 46 when it is the target of a delay 50 that has different minimum (MIN) and maximum (MAX) values as specified in a row of the Parameter Spreadsheet 38, as described further hereinafter. The delay 50 represents a cause and effect relationship between two edges 46, for example, a propagation delay caused by a signal going through a logic gate. A source edge 56 is an input signal transition and a target edge 58 is the resulting output signal transition.

In actual operation, the edge could occur anytime between these two points depending on the actual parts used to build the circuit. In the example of FIG. 3, the earliest arrival of the target edge 58 is 10 nanoseconds after the source edge 56; the latest arrival of the target edge 58 is 20 nanoseconds after the source edge 56. These values are determined by entries in the MIN and MAX columns of the Parameter Spreadsheet 38 shown at the top of FIG. 3. These values are typically obtained from semiconductor data books and/or from previously created Library Spreadsheets 40.

The most important concept to keep in mind when thinking about delays is that they "push" and "shove" edges on the PC monitor 12 to accurately depict the distances between the edges as indicated by the MIN/MAX values. The MIN/MAX values of a delay generate uncertainty for the target edge. The uncertainty indicates the earliest possible arrival (specified by MIN) and the latest possible arrival (specified by MAX) of the edge. When an edge that is a target of the delay is, in turn, used as the source for another delay, a timing chain is built. Along a timing chain, each edge has an uncertainty that indicates the accumulated uncertainty caused by all delays preceding it in the timing chain. These timing chains are maintained by the present invention so that the operator never has to calculate the exact position of any edge in a design.

The present invention displays edges in two ways: sloped and unsloped. Unsloped edges appear as straight vertical lines; sloped edges appear as sloped lines. The difference is for presentation purposes only because the calculations are exactly the same as described further hereinafter.

The present invention supports a plurality of different states for each waveform. A state is the steady-state portion of a waveform between two edges that represents the logic level of a signal at a point in time. States supported by the present invention include high (H), low (L), high impedance (Z), valid (V), and invalid (I). Note that clock waveforms have only high and low states.

DIAGRAM WINDOW

FIG. 3 illustrates a Diagram Window 36 which contains the graphical representation of the circuit timing. Included in the Diagram Window 36 are menus 60 that contain the commands used for creating diagrams; a tool bar 62 that provides an instant access to the most frequently used commands and functions; a horizontal ruler 64 that assists in the placement of edges in the waveforms and for making measurements; and scroll bars 66 that allow the operator to move around the design. Also included in the Diagram Window 36 is the waveform area 68 where the present invention draws waveforms, delays, constraints, and a waveform name area that displays the waveform names 70 and numbers 72, wherein the waveform numbers 72 are system generated labels and the waveform names 70 are operator specified labels.

PARAMETER SPREADSHEET

Figure 4:
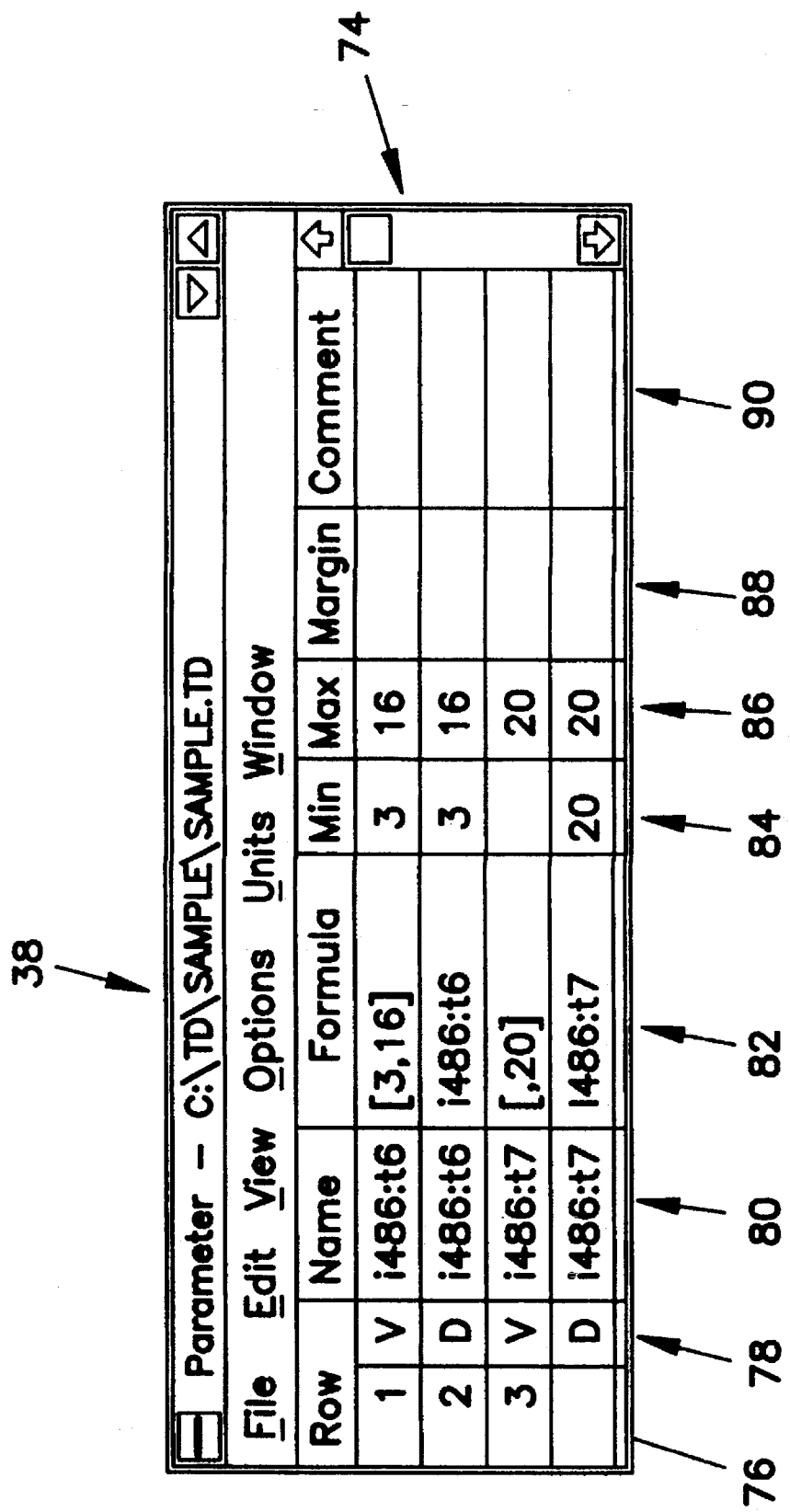
FIG. 4 is a block diagram illustrating the Parameter Spreadsheet window displayed by the present invention.

FIG. 4 further illustrates a Parameter Spreadsheet 38 which is linked to the Diagram Window 36. The Parameter Spreadsheet 38 is similar to parameter tables in a component data book and contains information about a current design. Each row 74 represents a timing parameter, for example, a delay, constraint, signal skew, or variable. The columns within each row 74 define the entry, such as row number 76 and type 78, name 80, formula 82, MIN/MAX 84/86, margin 88 and comment 90.

The Parameter Spreadsheet 38 differs from the Library Spreadsheet 40 in that the Library Spreadsheet 40 has no margin column 88. The reason for this is that the Library Spreadsheet 40 holds variables only and the margin column 88 is used only by constraints. The following summarizes the columns used in both types of spreadsheets.

The "row/type" column 76/78 describes the row number and type of entry. The number for a row is its ordinal position in the spreadsheet and the type indicates the type of information that row contains, for example, D for delay, C for constraint, V for variable and S for signal skew.

The "name" column 80 is a one-word, free-form identifier that conforms to certain rules. For example, all variable names must be unique and if an operator attempts to enter a duplicate name, the present invention will append the numeral to the end of the name to differentiate it from existing names. All other names should be unique, but the present invention will allow duplicates, for example, a constraint or delay might-both be named "FOO." Valid names consist of any keyboard characters, including punctuation and special characters.

The "formula" column 82 contains an algebraic formula used to compute the MIN and MAX values. If the operator enters a simple value, for example, 15, then the present invention automatically fills in the MIN and MAX columns 84 and 86 with that value.

The "MIN" and "MAX" columns 84 and 86 contain the delay time values of variables, delays or constraints. The MIN and MAX values are entered in one of two ways. If there is a formula in the formula column 82, the present invention automatically calculates the MIN and MAX values which then become non-editable. However, if the formula column 82 contains a number or is empty, the MIN and MAX columns 84 and 86 may be edited directly by the operator.

The "margin" column 88 is system generated and non-editable. The margin column 88 is used only for constraints in the Parameter Spreadsheet 38. The margin column 88 shows the amount of time by which the constraint is either satisfied or violated. Positive values indicate that the constraint is satisfied; negative values indicate that it is violated. If either of the two values of a margin is negative, the constraint is violated.

The "comment" field 90 is simply a free-form text field that may contain any information the operator chooses.

There can be no interaction with the Parameter Spreadsheet 38 window until there is a set of waveforms in the Diagram Window 36, and the operator has added a delay or a constraint between two edges in a waveform.

LIBRARY SPREADSHEET

The Library Spreadsheet 40 is similar to the Parameter Spreadsheet 38 except that it has no margin column 88. The Library Spreadsheet 40 contains only MIN/MAX variables, but these variables can be referenced by any number of designs. These MIN/MAX variables are often used in delay formulae, described further hereinafter. Typically, Library Spreadsheets 40 are used to import MIN/MAX variables into a Parameter Spreadsheet 38. The Library Spreadsheet 40 thus acts as an online data book.

Library Spreadsheets 40 are used to store lists of variables that are commonly used in many designs. By creating and maintaining these lists of variables, the operator can greatly speed their work and reduce errors. Note that the libraries contain only variables and that as many libraries as needed can be created and open at any time during a session.

A variable or group of variables can be sent from one spreadsheet to another. For example, if a new design demands a new set of variables which are entered into the Parameter Spreadsheet 38, the operator can then send them as a batch to a Library Spreadsheet 40 as well. To send the variables, the operator selects one or more variables in the Library Spreadsheet 40 window and then selects the Send command from the Edit menu so that the selected variables are copied to a destination Parameter Spreadsheet 38. Variables can also be sent in a similar manner from the Parameter Spreadsheet 38 to the Library Spreadsheet 40.

To import the variable by reference, the operator merely ensures that the variable to be referenced is in the Library Spreadsheet 40. Then, in the formula column 82 of the Parameter Spreadsheet 38, the operator enters the variable name. When the operator presses enter and leaves the field, the present invention evaluates the formula and, if needed, imports the referenced variable as well as any variables the referenced variable references so that they appear at the bottom of the Parameter Spreadsheet 38.

Occasionally a variable definition may have to be modified. The present invention allows the operator to modify the variable in one spreadsheet and then cause it to be updated in the other spreadsheets as well. This function exists because once the operator has a variable of a given name in the spreadsheet it cannot be copied again. To update variables, the operator selects the Update command from the Edit menu in the destination spreadsheet. For example, if the operator has changed variables in a Parameter Spreadsheet 38, then the operator would select the Update From The Parameter Spreadsheet command on the Edit menu in the Library Spreadsheet 40 so that the variables in the Library Spreadsheet 40 are updated also.

NUMERICAL VALUES

The present invention offers comprehensive numerical abilities. An operator can create variables and then combine those variables and formulas with mathematical operators.

All constants, variables and formulas have both a minimum value and a maximum value. This is called a MIN/MAX that has the form "[minimum,maximum]", e.g. [5,10], because most values represent a time which is not known exactly.

A variable may be used in place of a MIN/MAX. For example, if there is a gate delay of [5,10], the operator can name the delay GATE-DEL1 and use the variable GATE-DEL1 wherever they may have used [5,10]. Should the operator then choose a part with different specifications, they need only to change the value of the variable GATE-DEL1 to recalculate and redraw the timing relationships in the entire design.

Formulas are combinations of variables and mathematical operators, for example (2*GATE-DEL1)+[5,5].

VARIABLES

A variable is a spreadsheet row that can be referred to by name in the formulas in other rows. For example, if there is a gate delay of [5,10] that is used in many places in the design, it is easy to create a variable named DEL1 and use it rather than typing [5,10] in many places. In the illustration on FIG. 4, the variable in row 1 is referenced in the formula column of the delay in row 2. In a similar manner, the variable in row 3 is referenced in the formula column of the delay in row 4.

A name for the variable is entered into the name column as an alphanumeric string which determines how the variable is referenced. Each variable within a spreadsheet must have a unique name and if the duplicate name is entered, the present invention will automatically append a numeral to the name to differentiate it from others.

To create a new variable in either the Parameter Spreadsheet 38 or the Library Spreadsheet 40, the operator selects the Add Variable command from the Edit menu and a blank variable row is added to the bottom of the spreadsheet so that the information can be entered by the operator.

To delete a variable in either type of spreadsheet, the operator selects the variable or variables to be deleted and then selects the Delete command from the Edit menu. Note, that the present invention will automatically prevent the deletion of variables that are referenced in the Formula fields of other spreadsheet rows.

To use a variable, the name of the variable is simply entered into the formula column of a delay, constraint or variable. After the operator presses enter or clicks outside the field, the values of the row are updated with the variable information. If the variable entered is combined with other elements to create a formula, the MIN/MAX values will be grey indicating that they are derived from the formula and therefore cannot be directly edited in those fields. Note also that the present invention prevents circular references from occurring wherein a variable is referenced in its own Formula field.

TOOL BAR

Referring again to FIG. 1, there is a tool bar 62 present in the Diagram Window 36 in addition to pull-down menus 60. The tool bar 62 contains command buttons that perform a number of important functions. The New Signal button adds a new signal waveform. The New Clock button adds a new clock waveform. The Pointer button selects a pointer tool which is a general purpose tool used for replacing and moving edges, selecting objects, etc. The Text button selects a cross-hair tool that permits the operator to place and edit text blocks. The Delay button selects a delay source tool used to add delays. The Constraint button selects a constraint source tool that allows an operator to add constraints. The state buttons, i.e., High, Low, Valid, Invalid, and Z (high impedance), are used to change the state of a selected state or edge so that when an edge or state is selected, clicking one of these buttons changes the selected object to that state (note also that each of these buttons has a keyboard equivalent, such as "H" for high and "L" for low). The Delete button deletes a selected object; unlike the delete key, it is not used to delete individual text characters.

Table I lists the objects that appear in the timing diagram, describes how to select the object, and describes the indication that occurs when the object is selected. In general, the present invention indicates selection either by changing an object to reverse video or by surrounding it with a grey box called a selection box. Where objects such as the delay or-constraint label or text field overlap in the Diagram Window, a first click of the left mouse button selects one of the objects and each subsequent click selects an alternate object.

WAVEFORMS

Waveforms portray the working of a circuit design. Signals are waveforms that express the logic, data or control signals in a design. New signal waveforms can be appended to the bottom of a list of waveforms displayed on the PC monitor or inserted at any point in the list.

Figure 5:
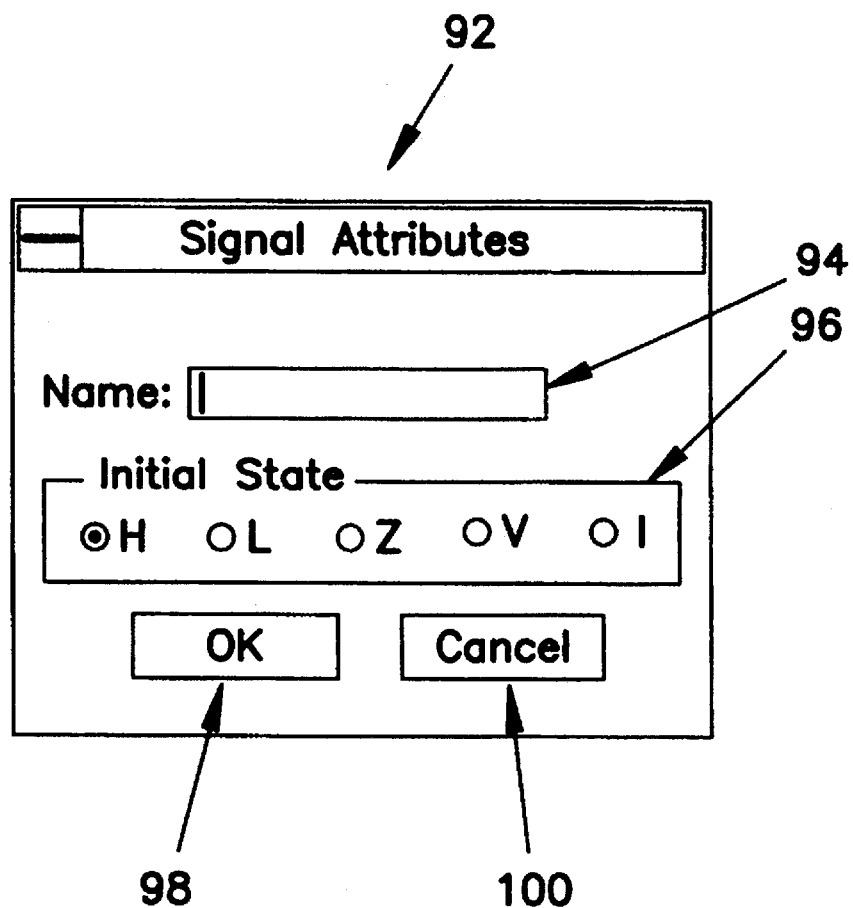
FIG. 5 is a block diagram illustrating the Signal Attributes dialog box displayed by the present invention.

To insert a new signal, the operator selects existing signal above which the new signal will be inserted. The New Signal button is clicked and a Signal Attributes dialog box appears. This dialog box 92 is illustrated in FIG. 5. The operator enters a signal name in the Name field 94 and specifies an Initial State option 96. The OK button 98 is clicked to complete the operation, or the Cancel button 160 is clicked to abort the operation. Thereafter, the new waveform appears above the waveform previously selected and its name is defaulted to the ordinal number of the waveform. The operator, however, does not have to give a name to a waveform using the dialog box because the present invention will provide one if it is not entered. Further, an operator can suppress the appearance of the dialog box 92 by selecting the Skip Signal Dialog command on the Options menu. If the operator does this, the present invention assigns a signal name and an initial state option of high.

The initial state automatically implies some kind of toggle pattern for the edges as they are added. For new waveforms, the pattern of these edges and states is predetermined and based on the state of the first edge. The predetermined toggle patterns for new waveformsare: H–L, L–H, V–Z, I–Z and Z–V. For example, if the operator creates a waveform which toggles between Z and V, then the initial state of the waveform merely needs to be set to Z so that the toggle pattern is in effect. For existing waveforms, the alternating pattern of the last two states is preserved with each new edge, for example, if the last two edges of a waveform are V and H, the first appended edge will be V, the second H, and so forth. An operator can also change the toggle pattern by changing the state of the edge just added. The new alternating pattern will be maintained by the present invention.

WAVEFORM SCROLLING

Referring again to FIG. 1, the scroll bars 66 in the Diagram Window 36 can be used by the operator to scroll, zoom and otherwise alter the display of waveforms on the PC monitor 12. A "smart ruler" feature of the present invention provides additional functionality to this otherwise standard feature.

The smart ruler feature provides a time reference for the waveforms. For example, in most CAD products, if the operator "zooms" the drawing by a factor of 1.3, the references tend to display odd increments, e.g., distances between tick marks on the ruler 64 are set to unusual values such as 34.5 nanoseconds. The present invention automatically calculates and re-draws the ruler 64 so that the units that are displayed in a more human-readable form, i.e., with the increment in multiples of five, ten, twenty or twenty-five units.

In addition, the operator can freeze one or more waveforms or rows at the top of the Diagram Window 36 so they do not scroll as the operator moves about the timing diagram and only the waveforms under the frozen waveforms scroll. This feature is often used with clock waveforms, which are typically a reference signal for the timing diagram. Thus, even though there may be many waveforms listed in the diagram, specified waveforms may be locked at the top of the Diagram Window 36 as the operator scrolls through the other waveforms.

EDGES AND STATES

Referring again to FIG. 1, edges and states are two components that make up a waveform. The present invention includes various features that allow the operator to add and to edit edges, to control edge attributes, and to add and control states. These features apply only to signal waveforms and not to clock waveforms. Clock waveforms are controlled through the use of the Clock Attributes dialog box, described further hereinafter, and are not directly editable.

The most basic task in creating a timing diagram is indicating where the edges are. For this reason, understanding how to manipulate edges is very important. The following discussion describes the operations performed on edges.

The present invention allows the operator to choose how the edges are displayed, either as sloped or unsloped edges, wherein unsloped edges are drawn at right angles to states. However, the edge type is merely a cosmetic decision and makes no substantive difference to the present invention.

Edges can be added to signal waveforms either at the end of the waveform or in the middle. When an edge is added in the middle of the waveform, a pulse is added, i.e., two edges and a state. In most diagrams, however, edges need only to be placed approximately because the final position for an edge most often depends upon timing relationships with other edges. In the present invention, the pointer tool is positioned where the operator wants the edge using a hair-line on the ruler face as a reference point. The operator then clicks the left mouse button and the edge is added.

WORKING WITH EDGES AND STATES

One typical operation is adding an edge to a waveform. Rather than having the engineer move the mouse along and draw a waveform as if they were drawing with a pencil and paper, what the present invention does is record each place where they click, add an edge at each place, and then automatically alternate between the two logical states of the waveform, i.e., high and low, valid and invalid, etc. The present invention ensures that each transition, e.g., high to low, in a waveform logically follows from the previous state, thereby preventing unrealizable state transitions, e.g., a low to high transition followed by another low to high transition. For example, at the first place the operator clicks, the present invention might draw an edge from high to low preceded by a high state; at the second place, the present invention would draw an edge from low to high followed by a high state; at the third place, the present invention would draw an edge from high to low, followed by a low state; and so on. The present invention leaves the newly added edge selected so that additional operations (e.g., changing its state, deleting the edge and the state following, etc.) may be easily performed.

The tool bar 62 in FIG. 1 includes the state buttons so if the operator clicks on one of the buttons the present invention changes the next alternating state. For example, if the operator clicks on the Valid button, even though the last state was high, the present invention assumes the last state was a valid state and begins alternating between valid and invalid. The present invention always alternates between the last two states drawn unless instructed otherwise. This automatically alternating of states is the quickest way to draw digital waveforms.

To insert a pulse into a waveform, the operator positions the pointer tool at the desired location and double clicks the left mouse button. A pulse of nominal width appears and the state of the pulse preserves the alternating pattern of the edges. If necessary, the operator can change the state or drag the edges to change its position.

Any edge or state in a signal can be deleted by selecting the edge or state and clicking the Delete button using the left mouse button. Note that when an edge is deleted that is a source or target of a delay or constraint, the delay or constraint is removed from the timing diagram, as well as the spreadsheet row that contains the name and the MIN/MAX values for the delay or constraints. Note that when a state is deleted that the edge on the left of the state is also removed from the timing diagram.

Edges that have no restrictions placed on them, meaning edges that are neither locked nor are the source or target of a delay, are free to move left and right. When an edge is part of a timing chain, i.e., a sequence of edges connected by delays with MIN/MAX times specified, all edges in the timing chain move left or right to preserve the MIN/MAX values of all delays involved. The only time this is not true is if the clock is the source of the timing chain.

Edges that are not part of a timing chain may not move for two reasons, they are either locked or-are edges in a clock. Locked edges are described further hereinafter.

To move an edge, an operator drags the edge using a pointer tool which then appears as the Edge Move tool. The left mouse button is released when the edge is in the desired location.

To change the state of an edge, the operator selects the edge and clicks the appropriate state button, or presses the right mouse button to cycle through possible edge states. This can sometimes be visually confusing when the change results in a transition from one state to the same state. Tick marks on the waveform are used to indicate an edge exists in that location even though it is a state-to-same-state transition.

EDGE ATTRIBUTES

Figure 6:
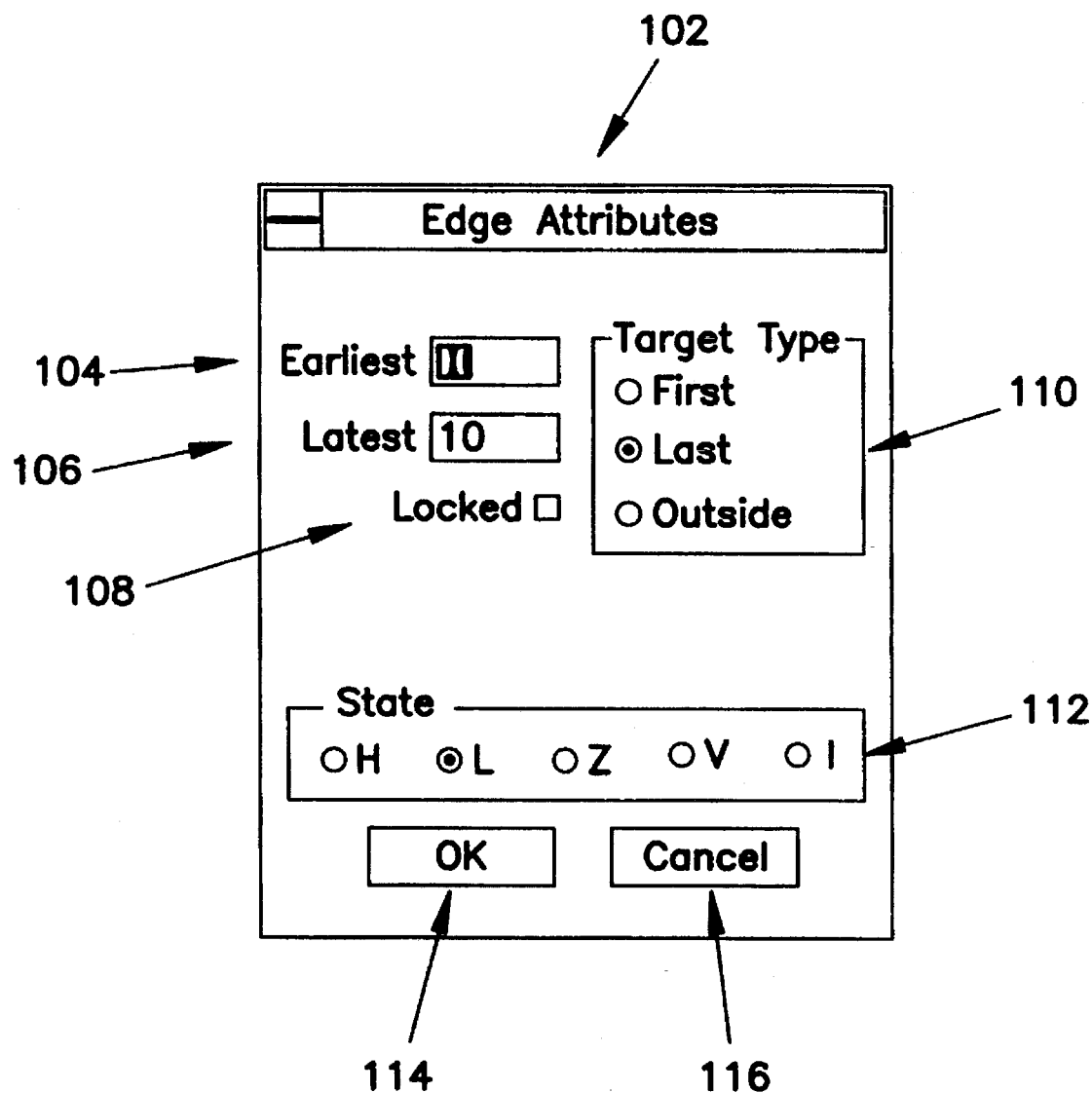
FIG. 6 is a block diagram illustrating the Edge Attributes dialog box displayed by the present invention.

FIG. 6 illustrates the Edge Attributes dialog box 102 which is used to control the functions and features of edges. To set or change edge attributes, the operator double clicks on an edge, or selects the edge and then selects the Attributes command from the Edit menu. The Edge Attributes dialog box 102 then appears.

The Edge Attributes dialog box 102 contains several fields for specifying edge attributes. The Earliest hand Latest fields 104 and 106 specify the earliest and latest occurrence of the edge. When these values are different, an uncertainty results. The width of the uncertainty region depends upon the delays driving the edge. If one field is changed, the other automatically updates to maintain the width of the uncertainty region. If there is no uncertainty region, then the fields are always identical.

The Locked field 108 locks the edge to the current point in time so that neither delays nor the mouse can move the edge. If the Earliest and Latest fields 104 and 106 have values which are different from each other, the edge will show uncertainty. Once an edge is locked, it no longer responds to the changes of the timing of a design so that the operator can fix the edge at a very specific time. Locking also allows the operator to place an edge arbitrarily, create an arbitrary uncertainty on an edge, or create a simple, graphic picture of timing, rather than a fully interactive timing diagram. Locking edges is an escape hatch that feeds the automated edge placement features of the present invention, as described further hereinafter, and should be used cautiously. Locked edges cannot be moved in any fashion until they are unlocked.

The Target Type field 110 affects only those edges that are the target of one or more delays. A complete description of how to choose target types is contained further hereinafter.

The State Field 112 sets or changes the state of the edge.

A Snap To Clock feature of the present invention enables an operator to place signal edges at precisely the same time as the edges of specified clock. The Snap To Clock feature works by creating an invisible grid based on the edges of the selected clock. When the Snap feature is on and the operator adds an edge, if the pointer is positioned approximately below a clock edge, the edge added by the operator snaps to the exact time of the edge in the selected clock waveform. The window for the Snap To Clock feature is equal to the width of a sloped edge. To enable the Snap To Clock feature, the operator selects a clock waveform and then selects the Snap To Clock command from the Options menu. The operator then creates the edges required to be snapped to the clock waveform.

DELAYS

Delays form the foundation of timing diagrams. A delay represents a propagation delay and implies a causal timing relationship between two edges. The relationship consists of two parts: the delay in the timing diagram that indicates the source and target edges, and the corresponding row of the Parameter Spreadsheet 38.

Referring again to FIG. 1, to specify a delay, the operator selects the edges involved in the Diagram Window 36, and then specifies, in the Parameter Spreadsheet 38, the MIN/MAX delay time values that the target edge trails the source edge.

Once both parts of the delay are in place, then the relative position of the two edges are automatically maintained by the present invention. This means that when the operator moves an edge that is the source or target of the delay, edges associated with that edge also move. This is how timing chains are built. As the operator works with his design, the timing chains are maintained by the present invention so that the operator never has to calculate the exact position of any edge in a design.

The signal waveforms 42 of FIG. 1 illustrate a timing chain and some of the features thereof. For example, using the ruler 64 for a reference, it is easy to illustrate how the delay times accumulate between signal waveforms 1, 2 and 3. The definition of delays is set forth as follows:

TARGET EARLIEST=SOURCE EARLIEST+DELAY MIN

TARGET LATEST=SOURCE LATEST+DELAY MAX

The calculation for the earliest arrival of the target edge is equal to the earliest arrival of the target edge plus the minimum value of the delay. Using signal 2 as an example: TE=(20+10)=30. The calculation for the latest arrival time of the target edge of signal 2, t is equal to the latest arrival of the target edge plus the maximum value of the delay, i.e., 30+20=50.

MULTIPLE DELAYS

A more complex type of delay structure is multiple delays with the same target. Multiple delays to the same target occur, for example, when the operator is modeling a gate with multiple inputs (sources) and only one output (target). How the target edge is positioned in these cases depends upon an attribute of the target edge called target type. The present invention offers four target types depending upon the function being described.

Referring again to FIG. 6, three options exist for the Target Type field 110 called First, Last, and Outside. The three types are roughly equivalent to the operation of OR, AND, and XOR gates, respectively. However, it is only a rough equivalency.

The way the present invention positions target edges when multiple delays are involved is to analyze the source delays and then identify the critical paths. Earlier in the specification the following formulas were presented to illustrate how delays are calculated:

TARGET EARLIEST=SOURCE EARLIEST+MIN

TARGET LATEST=SOURCE LATEST+MAX

These formulas are applied to each of the delays. Once the values are obtained, then the two critical paths are identified according to the combination rule wherein the word combination refers to which MINs and which MAXs are combined to position the target edge, i.e., which are the critical paths.

In the combination rule, the critical paths used to position the target edge depend upon the target type. Refer to Table II for a description of each target edge type. Note that in all cases it is possible for one delay to be the critical path for minimum calculations and another to be the critical path for the maximum calculations.

WORKING WITH DELAYS

To add a delay in the Diagram Window 36, the operator first specifies a delay relationship between edges, i.e., sometime after a first edge occurs, a second edge will occur. To add the delay to the diagram, the operator clicks the Delay button so that the Delay Source tool appears. The operator then clicks on the source edge of the delay and the Delay Target tool appears. The operator clicks on the target edge of the delay so that the system draws the delay. The Delay Source tool then returns. Immediately after adding a delay, the operator can add another delay, change to another tool by clicking a Tool button which aborts the process of adding a delay, or enter the MIN/MAX for the delay in the Parameter Spreadsheet 38.

When the operator adds a delay to a timing diagram, the delay has no effect on its edges until MIN/MAX values are associated with the delay. To add MIN/MAX values to a delay, the operator activates the Parameter Spreadsheet 38 and locates the row for the delay and then enters a formula or fills in numeric values into the MIN/MAX columns. One way to activate the Parameter Spreadsheet 38 is to move the mouse pointer into its window. If the delay is new, then as soon as that occurs, a new row appears and the operator then enters the minimum value (MIN) and the maximum value (MAX) for the delay. Alternatively, immediately after adding the target edge of the delay, the operator clicks the Pointer button for the pointer tool, and double clicks on the delay label so that the Delay Attributes dialog box, described further hereinafter, appears on the monitor 12. Then, in the formula field, the operator enters the formula or a MIN/MAX and clicks the OK button so that the values are automatically copied to the Parameter Spreadsheet 38. Alternatively, the Cancel button is clicked to abort the operation.

Once the MIN and MAX values are entered into the Parameter Spreadsheet 38, the Diagram Window 36 automatically re-draws those two edges so that, in reference to the ruler 64, the edges are precisely the specified distance apart. If the operator changes either value, the Diagram Window 36 will re-draw and change the positions of those two edges.

The delays between edges can be "hooked" together, so that there is a sequence of connected edges termed a "timing chain." Thereafter in the timing chain, every time a delay value is changed on one edge, the positions of edges connected thereafter may change. This operation is termed "pushing" and "shoving" edges, so that timing relationships entered into the Parameters Spreadsheet 38 are preserved.

To delete a delay, the operator either: (1) selects the delay in the diagram and then clicks on the Delete button; (2) deletes one of the edges of the delay on the diagram; or (3) selects the delay in the Parameter Spreadsheet 38 and then selects the Delete command from the Edit menu.

To hide a delay, the operator selects the delay in the diagram by selecting its label and then selects the Hide command from the View menu so that the delay disappears from the timing diagram. Alternatively, the operator can select the delay in the Parameter Spreadsheet 38 by selecting its row number and then selecting the Hide command from the View menu so that the row number in the Parameter Spreadsheet 38 turns light grey to indicate that the delay is hidden. As another alternative, the operator can double click on the delay label so that the Delay Attributes dialog box appears. The operator then checks the Hide box and clicks on the OK button so that the delay disappears from the timing diagram and the row number in the Parameter Spreadsheet 38 turns light grey to indicate that the delay is hidden. Alternatively, the Cancel button is clicked to abort the operation.

To show a hidden delay, the operator activates the Parameter Spreadsheet 38, selects the row of the hidden delay by clicking on the row number, and selects the Show command from the View menu in the Parameter Spreadsheet 38 so that when the Diagram Window 36 is reactivated the delay will reappear. Alternatively, the operator can select the Display Preferences command on the View menu so that the Display Preference dialog box appears, and then click the Grey option in the Hidden field and click the OK button. Thereafter, all hidden items are now grey instead of invisible, allowing the operator to identify objects.

SETTING AND CHANGING DELAYS

Figure 7:
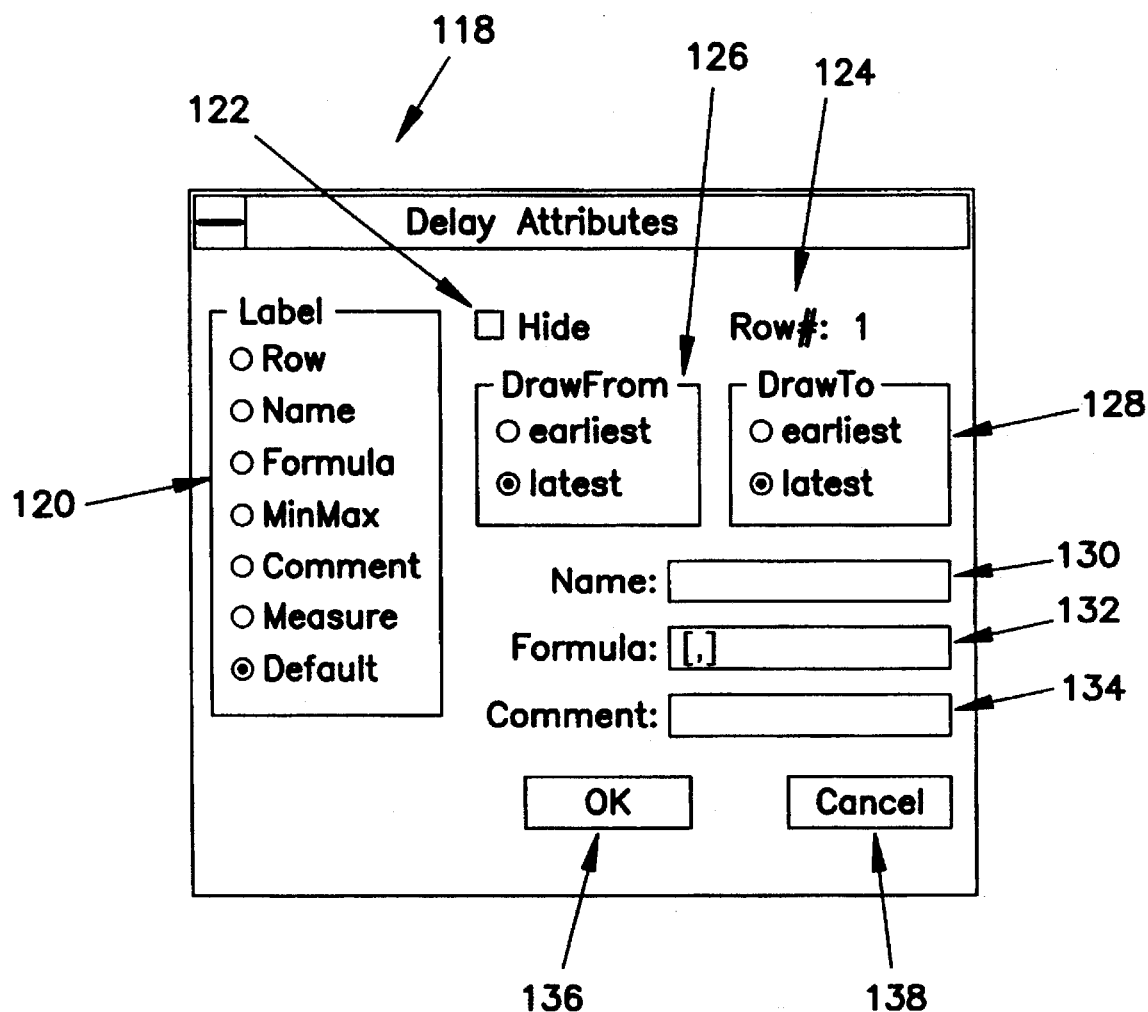
FIG. 7 is a block diagram illustrating the Delay Attributes dialog box displayed by the present invention.

FIG. 7 illustrates the Delay Attributes dialog box 118. The operator can edit all of the attributes of a delay using the Delay Attributes dialog box 118. To edit the delay, the operator double clicks on the delay label or selects the delay and then selects the Attributes command from the Edit menu. The Delay Attributes dialog box 118 then appears on the PC monitor 12.

The dialog box 118 has several fields. The Label field 120 includes buttons which are used to specify the label for the delay, such as data items from the Parameter Spreadsheet 38 associated with the delay, including row number, name, formula, MIN/MAX values, comments, and measures. The Hide box 122 is checked to hide the delay. The Row Number field 124 lists the row number of the delay in the Parameter Spreadsheet 38 to make it easier for the operator to check on the row number for the delay when the label is set to something other than row. The Draw From and Draw To fields 126 and 128 allow the operator to set how the delay is graphically displayed, wherein the Draw From options 126 determine where the source is indicated and the Draw to options 128 determine the target. The spreadsheet fields, comprising Name 130, Formula 132 and Comment 134, contain entries for the delay from the Parameter Spreadsheet 38, wherein if the operator edits the fields in the dialog box 118, those editing changes are then copied to Parameter Spreadsheet 38.

UNCERTAINTY REGIONS DUE TO VARIABLE DELAYS

Variable delays, specified by MIN/MAX values, cause uncertainty regions for edges. Assume that a first edge has a delay of [5,10] nanoseconds, i.e., [MIN,MAX], and is hooked to a second edge which has a delay of [5,7] nanoseconds. Thus, the second edge could occur sometime between 10 and 17 nanoseconds. The period between 10 and 17 nanoseconds is termed an "uncertainty region." Uncertainty regions are a reflection of the physical fact that there are variations in parts. If a third edge having a delay of [10,15] nanoseconds is hooked between the second edge and a fourth edge, then the third edge can occur somewhere between 20 and 32 nanoseconds, thereby indicating a 12 nanosecond uncertainty region. The present invention propagates the uncertainty regions.

However, the present invention will adjust constraint margins and measures to accommodate the existence of phantom uncertainties. Phantom uncertainties can be caused by multiple fanouts or because an edge is the source of more than one timing chain in the diagram. If there is a constraint which measures between the chains, then it is possible for the uncertainty of the source edge to be counted unnecessarily in the computation of measure and margin for the constraint. This is commonly known as reconversion fanout. The present invention automatically detects this situation by tracing back through all the delay paths or the critical paths to the source and target edges of the constraint to determine if these paths have a common ancestor. If so, the present invention automatically adjusts the measure and margin by adding in the uncertainty of the common edge.

CONSTRAINTS

A timing constraint is a limit measurement of the time between two edges. The timing constraint establishes a relationship between two edges that must be maintained in order for the circuit to work correctly. Set up and hold times are examples of constraints.

Constraints are used to define and test the time between two edges. There are two types of tests, termed inside and outside measure. An inside measure is taken from the latest that the first edge can occur to the earliest that the second edge can occur. An outside measure is taken from the earliest that the first edge can occur to the latest that the second edge can occur. Because these measure are actually conditions which must be met, a constraint that fails the test is violated and its representation in the timing diagram and its margin value in the Parameter Spreadsheet 38 both turn red on the PC monitor 12; otherwise both are displayed as green. Like delays, constraints are represented graphically in the Diagram Window 36 as indicated in FIG. 3.

The present invention automatically calculates a margin associated with each constraint. The margin indicates the amount of time by which the constraint is either satisfied or violated. The margin value can be used, for example, to determine whether a gate can be added or must be removed in a critical path. Margins are shown in the Parameter Spreadsheet 38.

Assume that a first edge, after all delays and uncertainty regions have been propagated, could occur as early as 20 and as late as 25 nanoseconds. Assume that a second edge connected thereto could occur as early as 27 and as late as 30 nanoseconds. If a constraint between the two edges was added that sets a limit between the edges of [5,10] nanoseconds, then there would be a problem because theoretically the first edge could occur at 25 nanoseconds and the second edge could occur at 27 nanoseconds. Thus, the specification that the edges never be closer than 5 nanoseconds has been violated.

The amount by which the constraint is violated, or the amount by which the constraint is satisfied, is termed a "timing margin." For every single constraint specified by the operator, the present invention will calculate and display the actual timing margin based on the delays entered in the Parameter Spreadsheet 38.

For example, if a circuit works, but all of the timing margins therein are 1 nanosecond, it may indicate too tight a tolerance, and that there is little margin for error. Alternatively, if all of the timing margins are 100 nanoseconds, it may indicate too loose a tolerance, and that the parts being used are too fast and more expensive then necessary.

WORKING WITH CONSTRAINTS

Constraints are established in the timing diagram by indicating source and target edges, and in the Parameter Spreadsheet 38 by entering MIN and MAX values.

To add a constraint, the operator clicks the Constraint button so that the Constraint Source tool appears. Using the tool, the operator clicks on the source edge of the constraint to select the edge and the Constraint Target tool then appears. The operator then clicks on the target edge of the constraint so that the target edge is selected and the present invention draws the constraint. The Constraint Source tool returns thereafter. Immediately after adding a constraint, the operator can add another constraint, change to another tool by clicking a Tool button, or enter the MIN/MAX values for the constraint in the Parameter Spreadsheet 38.

The MIN/MAX values for a constraint define tests that determine when the constraint is violated or satisfied. If the operator adds a constraint to a timing diagram but does not enter any values for it in the Parameter Spreadsheet 38, no test is performed and the constraint is essentially ignored.

Most of the time, an operator will enter a MIN value because the most common problem in a circuit design is not having enough time. A MIN value of 10 nanoseconds for a constraint means, for example, that the source edge must arrive no earlier than 10 nanoseconds before the target edge. Testing is done by analyzing a measure value. When a constraint is analyzed, two measure can be made: inside and outside.

The inside measure is taken from the latest of the source edge to the earliest of the target edge. The formula for inside measure is TARGET EARLIEST—SOURCE LATEST. The MIN for a constraint determines the inside measure.

The outside measure is taken from the earliest of the source to the latest of the target. The formula for outside measure is TARGET LATEST—SOURCE EARLIEST. The MAX value for a constraint determines the outside measure.

Because these measure are actually conditions which must be met, a constraint that fails either test is called violated, and its representation in the timing diagram of the Diagram Window 36 and its margin values in the Parameter Spreadsheet 38 both turn red; otherwise both are green because the test is satisfied.

The measure can be used as the label of a constraint and appears between curly braces in the Diagram Window 36. A typical measure would be {5.0,10.0}.

The present invention automatically calculates the margin associated with each constraint in the margin column 88 shown the Parameter Spreadsheet 38 indicates the amount by which the constraint is satisfied or violated. Margins appear in the margin column 88 of the Parameter Spreadsheet 38 between angled brackets. The first value, the MIN, tells the operator about the inside dimension; the second value, the MAX, tells the operator about the outside dimension. The margins may also contain negative values which indicate that the constraint has been violated. For example, a violated constraint margin value <−10,5> indicates from the minus 10 that the width of the measure is 10 nanoseconds too narrow, i.e., that the edges are 10 nanoseconds too close together in the worst case. In another example, a violated constraint margin value <10,−5> indicates from the minus 5 that the width of the measure is 5 nanoseconds too large, i.e., that the edges are 5 nanoseconds too far apart in the worst case. These negative margins indicate timing deficits that must be corrected.

Margin calculations are measure of time available beyond that required by the constraint. The formulas for margins are summarized as:

INSIDE (MINIMUM):

TARGET EARLIEST–SOURCE LATEST–MIN OF THE CONSTRAINT

OUTSIDE (MAXIMUM):

MAX OF THE CONSTRAINT–(TARGET LATEST–SOURCE EARLIEST)

To delete a constraint, the operator selects the constraint by selecting its label in the Diagram Window 36 and then clicking on the Delete button. Alternatively, the operator can delete one of the edges of the constraint in the Diagram Window 36. As another alternative, the operator can select the row number of the constraint in the Parameter Spreadsheet 38 and then select the Delete command from the Parameter Spreadsheet Edit menu.

When adding a constraint to a timing diagram, a constraint does not cause any test to be made until it has a numeric value associated with it. To add numeric values for a constraint, the operator activates the Parameter Spreadsheet 38 immediately after selecting the target edge of the constraint and then locates the row therein for the constraint and enters a formula or a MIN/MAX value. Alternatively, immediately after adding the target edge of the constraint, the operator clicks the Pointer button for the pointer tool. The operator double clicks on the constraint label so that the Constraint Attributes dialog box, described in more detail hereinafter, appears on the PC monitor 12. In the formula column of the dialog box, the operator enters a formula or a MIN/MAX and then clicks on the OK button. The values are thereafter copied to the Parameter Spreadsheet 38.

To hide a constraint, the operator selects the constraint by selecting its label in the Diagram Window 36 and then selects the Hide command from the View menu so that the constraint disappears from the timing diagram. Alternatively, the operator can double click on the constraint label so that the Constraint Attributes dialog box appears, and then checks the Hide box and clicks on the OK button so that the constraint disappears on the timing diagram. As another alternative, the operator selects the constraint by selecting its row number and the Parameter Spreadsheet 38 and then selects the Hide command from the View menu so that the row number in the Parameter Spreadsheet 38 turns light grey to indicate that the constraint in the diagram is hidden.

To show a hidden constraint, the operator activates the Parameter Spreadsheet 38 and selects the row of the hidden constraint by clicking on the row number. The Show command is then selected from the View menu in the Parameter Spreadsheet 38 so that when the operator activates the Diagram Window 36, the constraint reappears.

Alternatively, the operator can select the Display Preferences command on the View menu so that the dialog box appears and then click the Grey option in the Hidden field and the OK button so that all items which are hidden turn grey thus allowing the operator to choose the objects to show fully on the PC monitor.

SETTING AND CHANGING CONSTRAINTS

Figure 8:
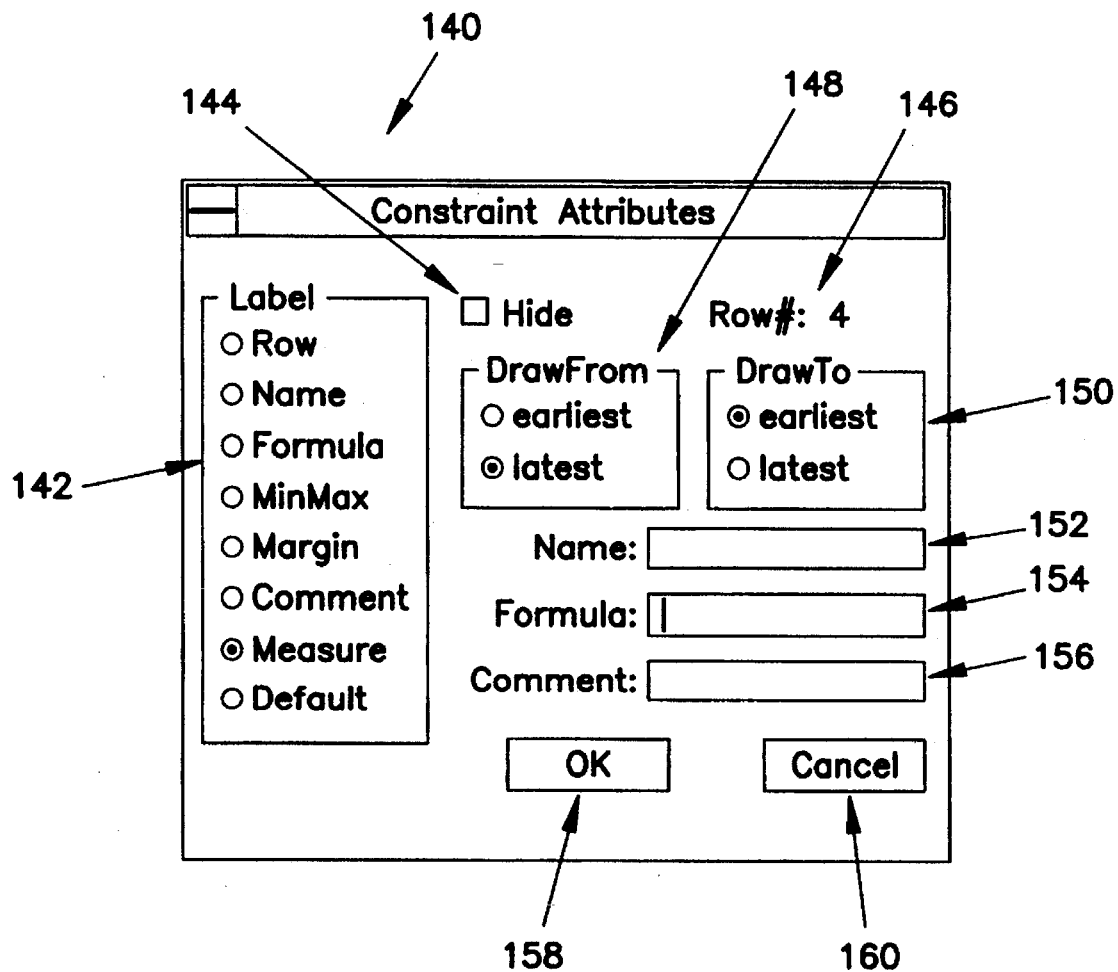
FIG. 8 is a block diagram illustrating the Constraints Attributes dialog box displayed by the present invention.

FIG. 8 illustrates the Constraint Attributes dialog box 140. The operator can edit all of the attributes of a constraint using the Constraint Attributes dialog box 140. To edit the constraint, the operator double clicks on the constraint label or selects the constraint and then selects the Attributes command from the Edit menu. The Constraint Attributes dialog box 140 then appears on the PC monitor.

The dialog box 140 has several fields. The Label field 142 includes buttons which are used to specify the label for the constraint, such as data items from the Parameter Spreadsheet 38 associated with the constraint, including row number, name, formula, MIN/MAX values, comments, measures, and margins, which labels will change as the values for the data items change. The Hide box 144 is checked to hide the constraint. The Row Number field 146 lists the row number of the constraint in the Parameter Spreadsheet 38 to make it easier for the operator to check on the row number for the constraint when the label is set to something other than row. The Draw From and Draw To fields 148 and 150 allow the operator to set how the constraint is graphically displayed, wherein the Draw From options 148 determine where the source is indicated and the Draw To options 150 determine the target. The spreadsheet fields, comprising Name 152, Formula 154 and Comment 156, contain entries for the constraint from the Parameter Spreadsheet 38, wherein if the operator edits the fields in the dialog box 140, those editing changes are then copied to Parameter Spreadsheet 38.

DISPLAYING DELAYS AND CONSTRAINTS

When displaying or printing a timing diagram, the present invention automatically formats the timing diagram in a way that ensures that it will be readable. The present invention provides adequate space between the waveforms to allow the horizontal portions of delays and constraints to fit without conflict. In addition, the present invention eliminates unnecessary space between waveforms, thereby maximizing the amount of useable information presented to the operator in a given size window or on a give size page.

The present invention accomplishes these features using a number of rules. Only delays and constraints that have both their source and target edges within the displayed or printed area are considered. Thus, space is not wasted on delays and constraints that do not appear. Next, the horizontal interval required for delay and constraint is computed. Finally, each delay and constraint is assigned to a slot which is a horizontal stripe of fixed height between waveforms in such a manner that any delays or constraints whose horizontal portions have intersecting intervals are assigned to a different slot. This ensures that the delays and constraints do not collide graphically. This process also determines the number of slots required between two waveforms, and thereby, the amount of space needed to be allocated between the waveforms.

WORKING WITH SIGNAL SKEWS

Using signal skews in a design is a way to take advantage of relationships known to exist between two specific delays. Manufacturers of parts occasionally publish skew values wherein the value is a percentage increase in the timing margin that can be claimed because the signals are physically within the same physical part and are subject to identical physical and manufacturing conditions. Skews are easily implemented by an entry in the Parameter Spreadsheet 38.

To specify a signal skew, the operator identifies the signal involved and selects the Add Signal Skew command from the Edit menu in the Parameter Spreadsheet 38. This command causes a new row to appear. In the name column, the operator enters the signals that are related by the skew separated only by commas, for example, "SIG1,SIG2, DATA". The operator then enters the percentage value of the skew in the formula column.

Figure 9:
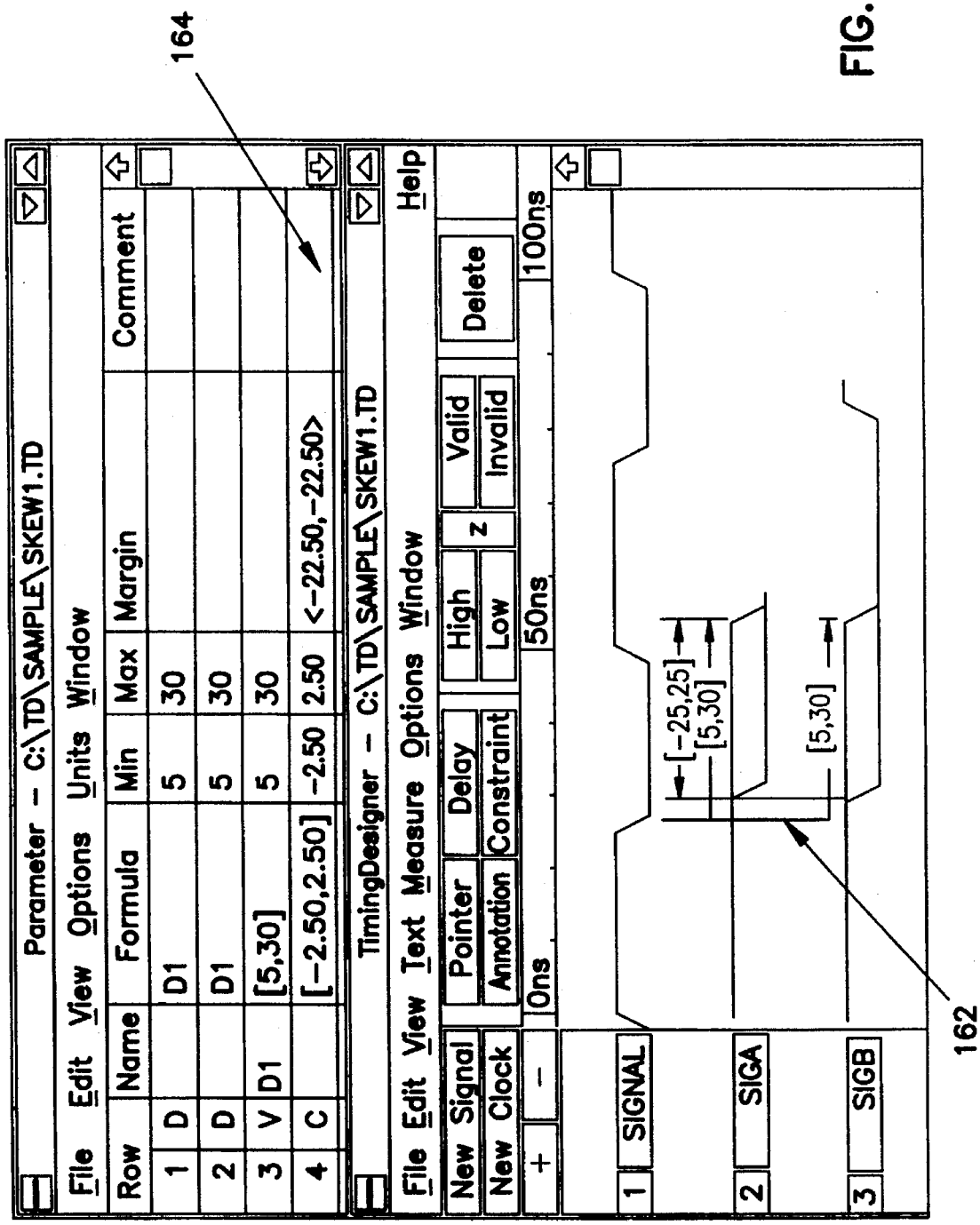
FIGS. 9 and 10 are block diagrams illustrating how signal skews are handled by the present invention.

For example, FIG. 9 is a representation of a buffered signal wherein two buffers each has associated therewith a delay value 162 of [5,30]. The value of the constraint 164 shown in row 4 of the Parameter Spreadsheet 38 establishes the tolerance expected out of the design. The MIN/MAX values indicate that the circuit will not work if there is more than 5 nanoseconds of difference between the arrival of signals SIGA and SIGB. The margin shown in the Parameter Spreadsheet 38 reflects the distance between the two edges minus the MIN/MAX of the constraint 164. The distance of 25 nanoseconds between the two edges is also the width of the uncertainty on the signals SIGA and SIGB.

Figure 10:
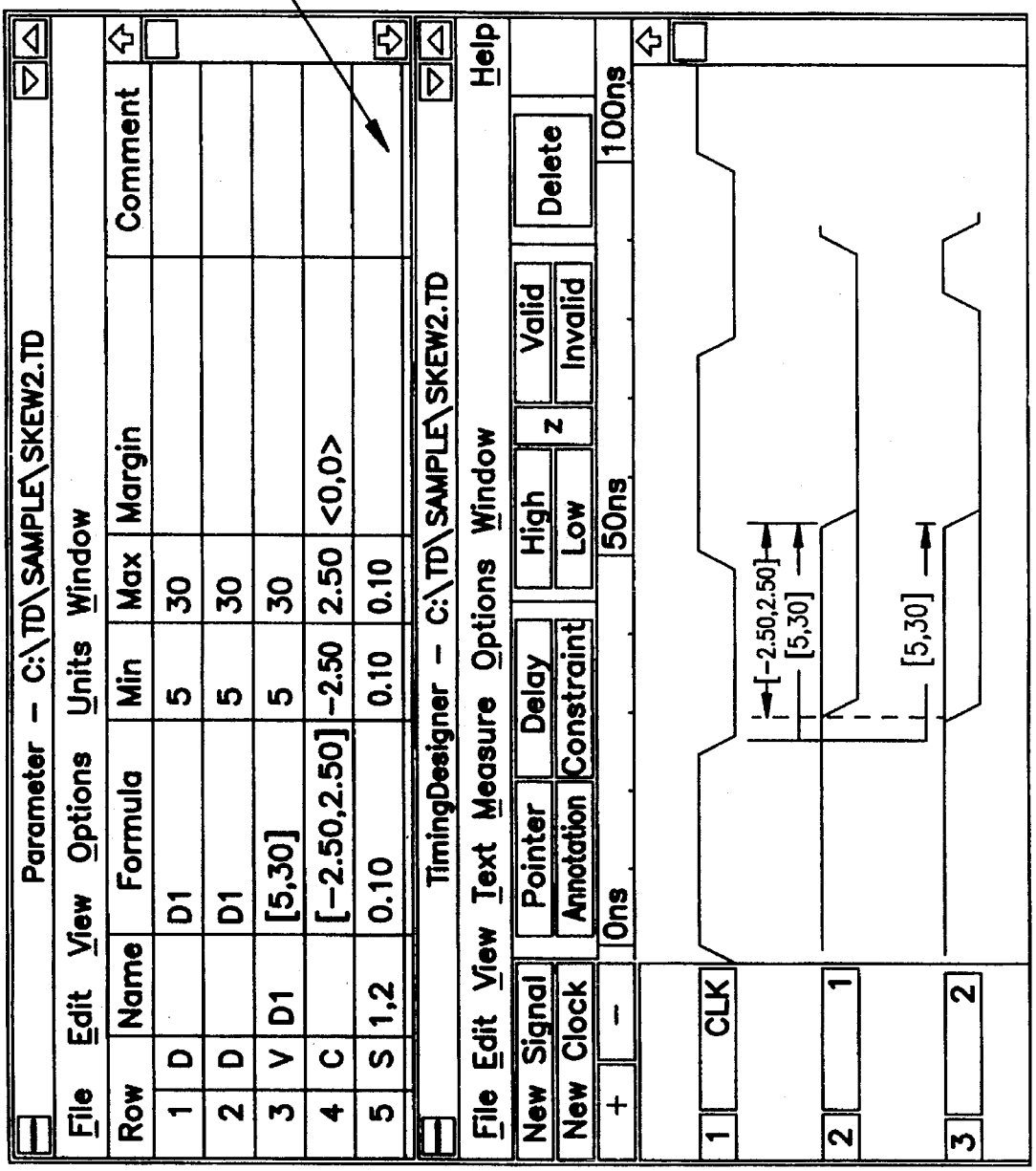

As it stands, the design shown fails because it has constraints with negative margins. At this point, the signal skew is introduced as illustrated in FIG. 10. Suppose the gates that generate SIGA and SIGB are both physically in the same package. When this is the case, manufacturers can guarantee better performance. If a skew 166 of 10% is introduced in row 5 of the Parameter Spreadsheet 38 the following results occur: the margin is {0,0}; and the measure of the constraint between signals SIGA and SIGB is {-2.5, 2.5}. The formula for computing the skew is: (1−K)*(MAX-MIN). This yields 22.5 which is the value added to the margin and the measure.

CLOCKS

Clock signals differ from other signals in two ways. First, clock waveforms are regular and periodic. Second, clocks are specified using a dialog box rather than being drawn using the mouse. The following discussion describes the operations for clock waveforms.

The present invention allows the operator to define an infinitely long clock signal in terms of its fundamental parameters, including frequency, period, duty cycle, offsets, and jitter. Further, these parameters can be Parameter Spreadsheet 38 variables. This permits the definition of multiple clocks which are functions of common Parameter Spreadsheet 38 variables. Further, any of the parameters can be defined by formulas consisting of variables, numeric values, and mathematical operators.

To add a clock in the middle of a diagram, the operator selects a waveform using the mouse so that the clock is added above the waveform. The Operator then clicks on the New Clock button so that the Clock Attributes dialog box appears.

Figure 11:
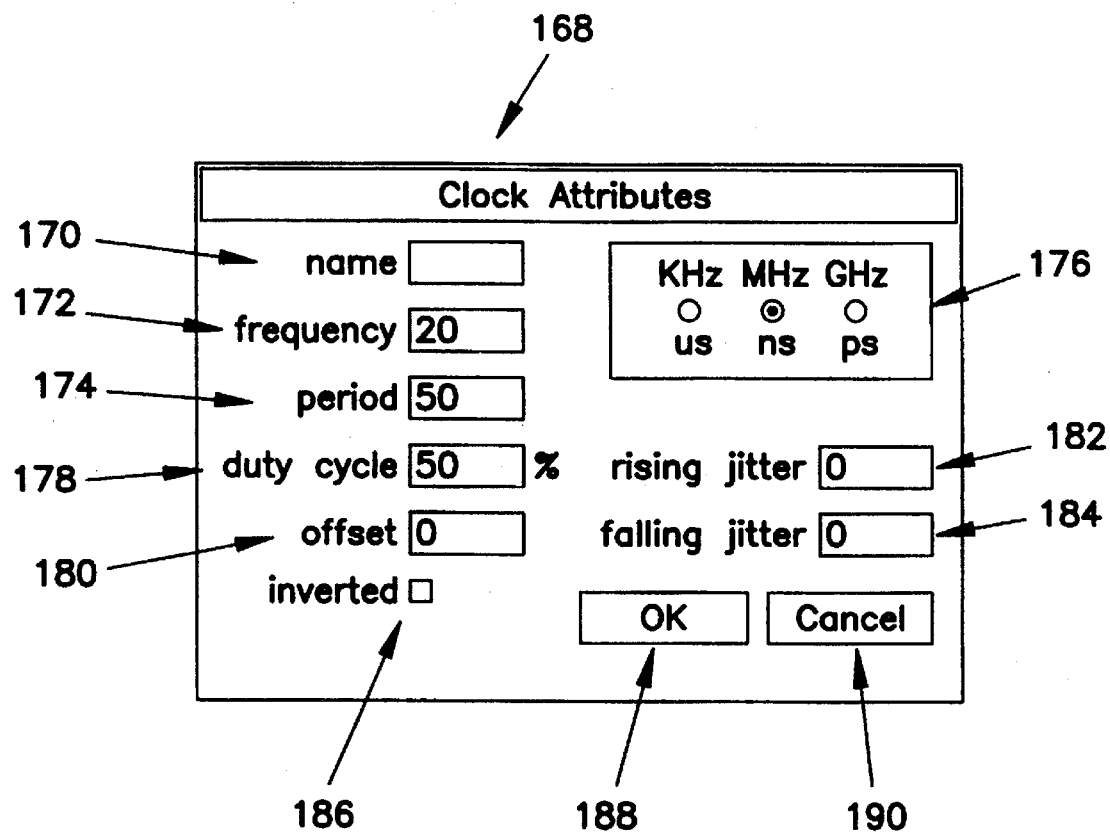
FIG. 11 is a block diagram illustrating the Clock Attributes dialog box displayed by the present invention.

FIG. 11 illustrates the Clock Attributes dialog box 168. Using the dialog box 168, the clock waveform is defined by entering the necessary parameters and then clicking on the OK button to accept the changes or the Cancel button to abort the dialog box 168. Thereafter, the clock waveform is inserted above the waveform previously indicated.

Within the Clock Attributes dialog box 168 there are a number of different fields. The Name field 170 defines the name of the waveform. The operator may omit an entry, and a waveform name and number will be automatically assigned.

The Frequency and Period fields 172 and 174 define the length of a clock cycle. The operator is free to specify either of the fields; an entry in one is automatically reflected in the other. The frequency is expressed in hertz (HZ) and the period is expressed in fractions of a second according to the Unit button 176 selected by the operator.

The Duty Cycle field 178 specifies which portion of the clock cycle in which the signal is high. The duty cycle is expressed as a percentage of the period.

The Offset field 180 specifies location of the first transition within the clock cycle. An offset value was used to shift the whole clock to the right expressed in time units according to the Unit button 176 selected.

The Rising and Falling Jitter fields 182 and 184 specify the uncertainty in the arrival time of the rising of following clock edges, respectively. Jitter is specified in time units according to the Unit button 176 selected.

The Inverted field 186 changes the default state of a clock waveform from its default of low to high.

A derived clock is a clock waveform that is based on some other clock waveform. Using variables and formulas to specify the parameters of clocks makes it easy to derive one clock from another. It also insures that if one clock changes, the other changes automatically.

DISPLAY PREFERENCES

Figure 12:
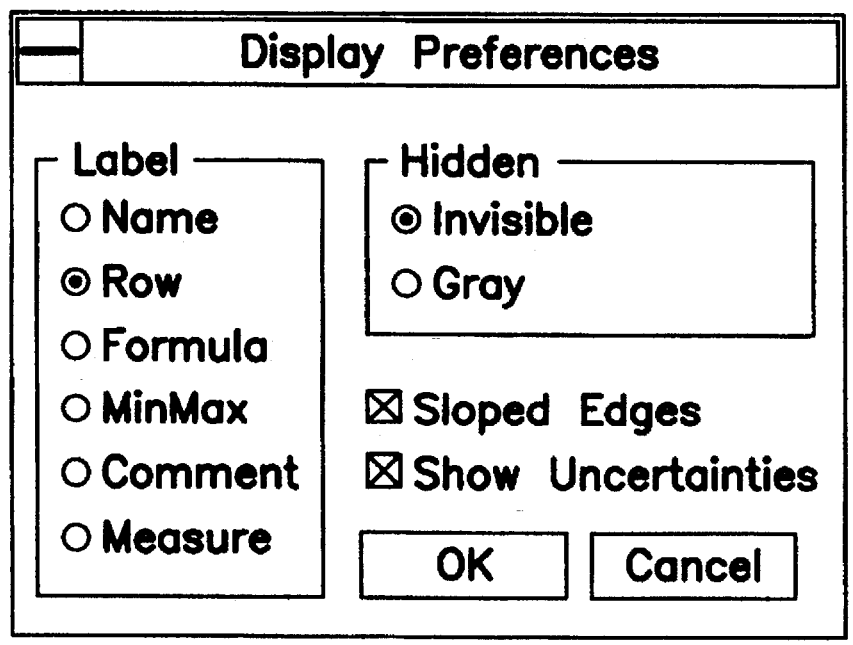
FIG. 12 is a block diagram illustrating the Display Preferences dialog box displayed by the present invention.

FIG. 12 illustrates the Display Preferences dialog box 192 that the operator uses to control labels, whether the edges are sloped, and whether uncertainties are shown. To set global defaults, the operator selects the Display Preferences command from the View menu in the Diagram Window. The Display Preferences dialog box 192 appears and the operator indicates the default state for labels, edge displays, and uncertainties and then clicks on the OK button so that the new defaults are accepted. All waveforms, delays and constraints added after these traces are made will reflect the choices.

To make an exception to global labeling, the operator is free on a case by case basis to change a delay or constraints label so as to tune the timing diagram's appearance. The operator selects the delay or constraint label to be changed and then selects one of the Show Label commands from the View menu. If the operator wants the label to reflect the global settings, the delay or constraint is selected in the Diagram Window 36 or Parameter Spreadsheet 38 and then the Show Default command from the View menu and the respective window is selected.

ANNOTATIONS

The present invention permits the use of annotations, which are labels or comments placed at certain locations on a timing diagram. Each annotation is contained with an a bounding box and the annotations can be moved anywhere within the design. When an annotation is added to the timing diagram it is automatically attached to the edge closest to where the annotation begins. Thereafter, whenever the edge moves, the annotation automatically moves with it.

To add an annotation, the operator clicks on the Annotation button and the cross-hair tool appears. The operator then clicks where they want the annotation to begin, which creates an insertion point enclosed by a small bounding box. The operator begins typing and the bounding box expands to accommodate the text entered. All keyboard characters and commands are valid within the box. Similar technique applies for editing annotations by clicking with the cross hair tool in a-previously existing annotation bounding box. Annotations can be deleted by using the Pointer tool and then clicking on the Delete button.

A Smart Snap feature is available wherein the present invention automatically places any text in the most appropriate position relative to an edge. This features tries to place annotations in the horizontal plane of the signal to which they are associated. If this is impossible, the annotation is placed directly above the attachment point. Further, this feature causes the attachment to jump from edge to edge as the annotation is moved around the diagram.

PRINTING

Figure 13:
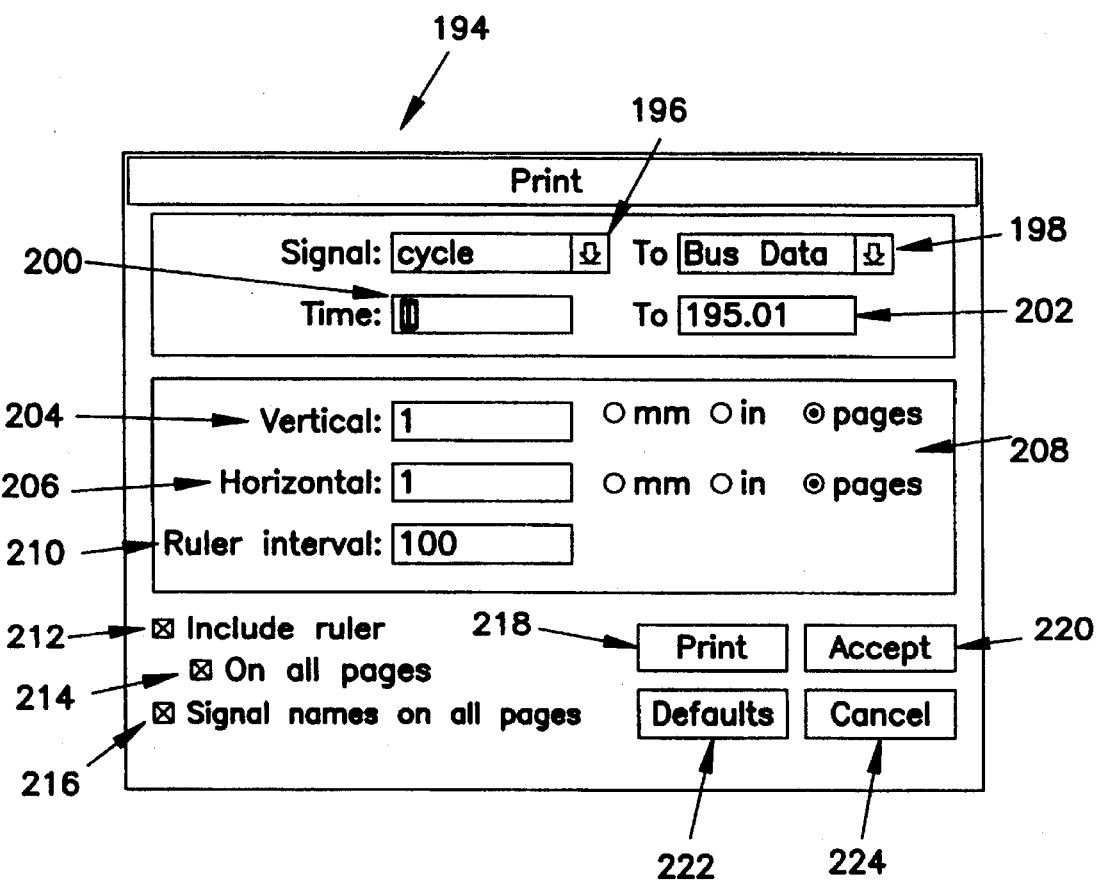
FIG. 13 is a block diagram illustrating the Print dialog box displayed by the present invention.

The present invention allows the printing of information from Diagram Windows 36, Parameter Spreadsheets 38 or Library Spreadsheets 40. The process for each is similar and is done by using the Print dialog box as is illustrated on FIG. 13. The operator makes the appropriate selections within the box and clicks OK when done which initiates the printing process.

The two boxes 196 and 198 associated with the Signal parameter specify the range of signals to be printed. The two boxes 200 and 202 associated with the Time parameter specify the time line be printed. The Vertical and Horizontal fields 204 and 206, and Options buttons 208 specify the vertical and horizontal space allotted to the chosen data. The Ruler Interval field 210 specifies the interval between major ticks in the ruler and four minor ticks will separate major ticks regardless Of the interval chosen. The Include Ruler options 212 and 214 cause the ruler to be printed on the top of the first page or all pages. The Signal Names On All Pages option 216 will cause the signal names to appear on each page; otherwise they appear only on the first page.

DATA STRUCTURES

Figure 14:
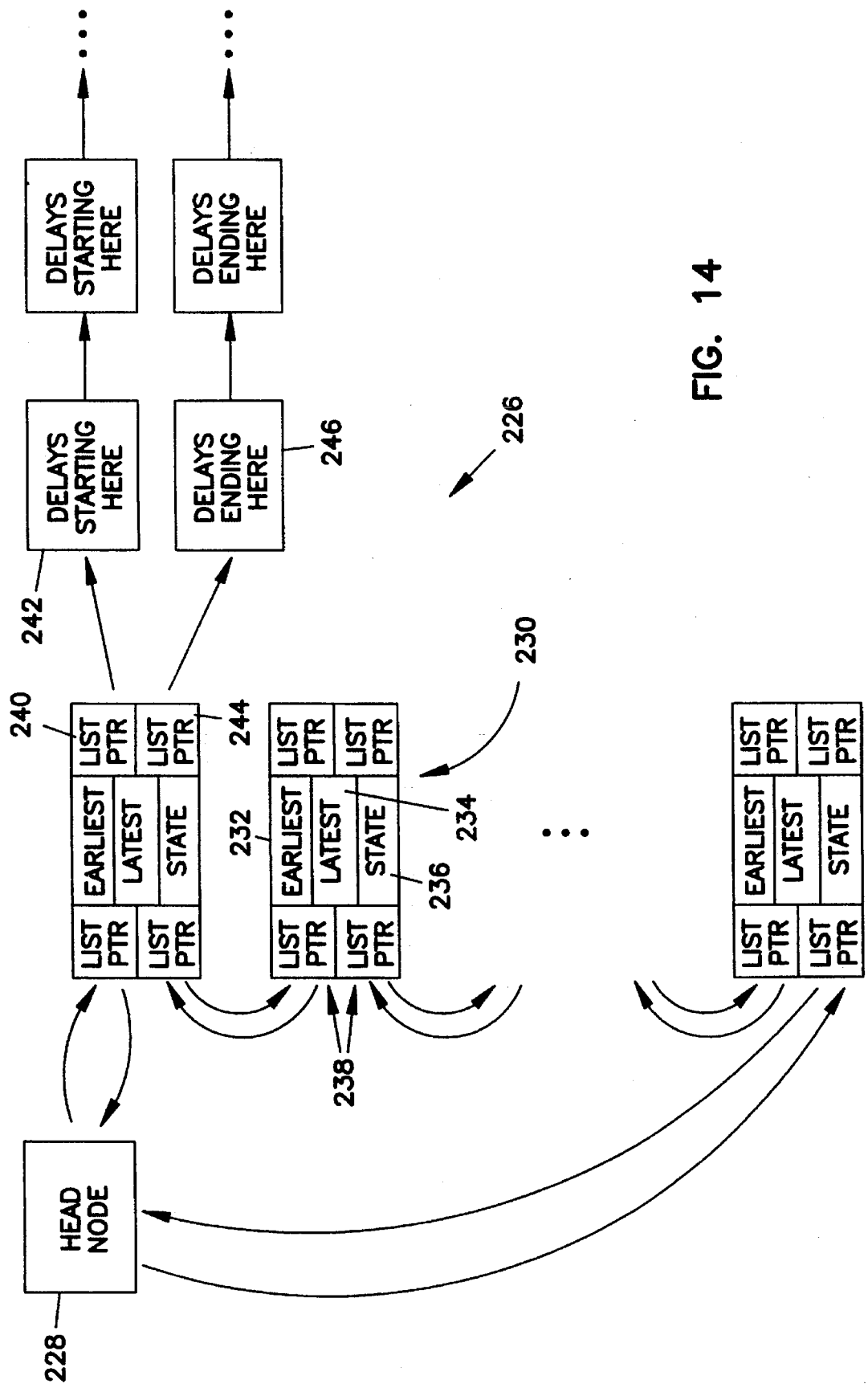
FIG. 14 is a block diagram illustrating the linked lists used by the present invention to manage edges and waveforms.

FIG. 14 illustrates how data is stored by the present invention in linked lists 226. Each waveform is maintained as a sequence of edge nodes 230 in a linked list 226 identified by a head node 228. The edge nodes 230 in the linked list 226 have at least three pieces of information: (1) the earliest 232 the edge could occur; (2) the latest 234 the edge could occur; and (3) what the state 236 of the waveform will be following that edge. In addition, each edge node 230 stores a constraint and a pointer to text annotations. The delays and the constraint may be stored as a formula that is used to calculate its minimum value maximum value.

As edges are pushed and shoved, the present invention traverses the linked list 226 and updates the values for each edge node 230. The time values therein are stored in a base of picoseconds, although other bases could be used as well.

Each edge node 230 in the linked list 226 also points 240 to a list of the delays 242 that start from the edge node 230 (i.e., edges that are "shoved" when the delay for edge changes) and points 244 to a list of the delays 246 that end in the edge node 230 (i.e., edges that "push" the edge when the delays for the edges change). When the position of an edge is changed, e.g., when its delay is increased, the linked list 226 is traversed until the edge node 230 is found. The found edge node 230 has its list of edges that start from it, and all those edges are "pushed" to correctly reflect the increased delay.

CONCLUSION

This concludes the description of the preferred embodiment of the invention. The following paragraphs describe some alternative methods of accomplishing the same objects.

Further information on the functions and operations of the present invention is available in the publication by Chronology Corp., "Timing Designer; the interactive timing analyzer; User Manual," V1.2 for Windows™, 1991 which publication is incorporated by reference herein.

Rather than operating in a WINDOWS™ 3.0 operating environment, other platforms could be used as well, such as the MACINTOSH™, X WINDOWS™, or OS/2™. Further, a "windowing" environment is not necessarily a prerequisite to implementing an equivalent to the computer program of the present invention, as it is well known to provide similar user interfaces in a normal MS-DOS™ operating environment.

A different pointing device such as a touch-screen or light pen could be used in place of the mouse. Further, an entirely keyboard driven interface could be used as well. While these might have benefits over the method described herein, many computers are now equipped with a pointing device.

Instead of storing the data in linked lists, other data structures such as arrays and files could be used instead.

In summary, a computer program has been described that automates the entry, modification, and verification of timing diagrams for electrical circuits. The computer program also provides an automated mechanism for analyzing these timing diagrams and verifying that the timing relationships specified for the circuit are met using the parts selected for the circuit.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

TABLE I

| Object | Select by | Selection indicated when |
| --- | --- | --- |
| Waveform | Clicking with the Pointer tool on the waveform number | The waveform number changes from light to dark gray |
| Waveform name | Clicking with the Pointer tool on the waveform name | The waveform name background changes to white, and an insertion point appears |
| Edge | Clicking with the Pointer tool on the edge | A light gray selection box surrounds the edge |
| State | Clicking with the Pointer tool on the state | A light gray selection box surrounds the state |
| Text blocks | Clicking with the Pointer tool or the Crosshair tool on the text block | A light gray selection box surrounds the text |
| Delays | Clicking with the Pointer tool on the delay label | A selection box surrounds the horizontal portion of the delay |
| Constraints | Clicking with the Pointer tool on the constraint label | A selection box surrounds the horizontal portion of the constraint |
| Spreadsheet row | Clicking with the Pointer tool on the row number | The row number turns dark gray |
| Spreadsheet cell | Clicking with the Pointer tool in the cell | The insertion point appears, and the cell expands if necessary |

TABLE II

| | Combination Rule: | |
| --- | --- | --- |
| Target edge type: | Value of t.e | Value of t.l |
| First | Smallest | Smallest |
| Last | Largest | Largest |
| Outside | Smallest | Largest |

What is claimed is:

1. A computer-implemented apparatus for constructing timing diagrams to model electrical circuits, comprising:

a computer having a monitor attached thereto;

data entry means for accepting one or more parameters defining a timing diagram into the computer;

means for displaying the timing diagram on the monitor of the computer in response to the parameter accepted into the data entry means, wherein the timing diagram comprises at least one waveform and the waveform comprises one or more edges;

wherein one of the parameters comprises a delay that defines a cause and effect relationship between first and second edges and a time between the first and second edges, the time comprises minimum and maximum delay values, and the minimum and maximum delay values define an uncertainty region representing a range of possible time values for an occurrence of the second edge;

means for propagating and accumulating uncertainty regions through a plurality of edges connected by delays;

means for calculating an uncertainty region for an edge that is a target of one or more delays;

wherein one of the parameters comprises a constraint that defines an allowable time between the edges in the waveform, and the constraint comprises minimum an maximum allowable time values, and another one of the parameters comprises a skew between two of the waveforms;

means for calculating a timing margin by determining a difference between the minimum and maximum allowable time values between two edges as defined by the constraint and the minimum and maximum delay values between the two edges as calculated by the means for propagating and accumulating uncertainty regions as defined by the delays; and means for adjusting the calculated timing margin based on the skew.

2. The apparatus of claim 1, further comprising means for automatically removing common delays from the calculation of the timing margin.

3. The apparatus of claim 1, further comprising means for analyzing the timing diagram and means for verifying that each constraint is satisfied.

\* \* \* \* \*

UNITED STATES PATENT AND TRADEMARK OFFICE
CERTIFICATE OF CORRECTION

PATENT NO. : 5,576,979

DATED : November 19, 1996

INVENTOR(S) : Lewis et al.

It is certified that error appears in the above-identified patent and that said Letters Patent is hereby corrected as shown below:

Column 2, line 41, delete "and" and insert --are--.

Column 9, line 26, after the word "selects" insert the word --an--.

Column 9, line 47, delete "waveformsare" and insert --waveforms are--.

Column 12, line 2, delete "hand" and insert --and--.

Column 16, line 7, delete "measure" and insert --measures--.

Column 17, line 7, delete "measure" and insert --measures--.

Column 17, line 17, delete "measure" and insert --measures--.

Column 21, line 39, delete "in a-previously" and insert --in a previously--.

UNITED STATES PATENT AND TRADEMARK OFFICE
CERTIFICATE OF CORRECTION

PATENT NO. : 5,576,979

DATED : November 19, 1996

INVENTOR(S) : Lewis et al.

It is certified that error appears in the above-identified patent and that said Letters Patent is hereby corrected as shown below:

Column 21, line 44, delete "features" and insert --feature--.

Column 22, line 1, delete "Of" and insert --of--.

Column 24, claim 1, line 28, delete "an" and insert --and--.

Signed and Sealed this

Fifteenth Day of July, 1997

Attest:

BRUCE LEHMAN

*Attesting Officer*  *Commissioner of Patents and Trademarks*